(12) United States Patent
Ami

(10) Patent No.: US 12,500,210 B2
(45) Date of Patent: Dec. 16, 2025

(54) MODULE

(71) Applicant: FUJI ELECTRIC CO., LTD., Kawasaki (JP)

(72) Inventor: Hideo Ami, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 801 days.

(21) Appl. No.: 17/683,069

(22) Filed: Feb. 28, 2022

(65) Prior Publication Data

US 2022/0189930 A1  Jun. 16, 2022

Related U.S. Application Data

(63) Continuation of application No. PCT/JP2021/002005, filed on Jan. 21, 2021.

(30) Foreign Application Priority Data

Mar. 18, 2020 (JP) .................. 2020-048329

(51) Int. Cl.
*H01L 25/07* (2006.01)
*H01L 23/00* (2006.01)

(52) U.S. Cl.
CPC ............ *H01L 25/072* (2013.01); *H01L 24/48* (2013.01); *H01L 2224/48137* (2013.01); *H01L 2224/48153* (2013.01)

(58) Field of Classification Search
CPC ....... H01L 24/48; H01L 24/49; H01L 25/072; H01L 2224/48137; H01L 2224/49175
See application file for complete search history.

(56) References Cited

U.S. PATENT DOCUMENTS

2018/0191337 A1   7/2018  Masuda et al.
2018/0247923 A1*  8/2018  Hartmann ............... H01L 24/48

FOREIGN PATENT DOCUMENTS

| JP | H04133670 A | 5/1992 |
|----|-------------|--------|
| JP | H10285950 A | 10/1998 |
| JP | 2004056984 A | 2/2004 |
| JP | 2005268649 A | 9/2005 |
| JP | 2007006584 A | 1/2007 |
| JP | 2008005636 A | 1/2008 |
| JP | 2009021345 A | 1/2009 |
| JP | 2011188540 A | 9/2011 |
| JP | 2016103887 A | 6/2016 |
| WO | 2017199580 A1 | 11/2017 |

OTHER PUBLICATIONS

International Search Report of PCT/JP2021/002005.

* cited by examiner

*Primary Examiner* — Britt D Hanley
*Assistant Examiner* — Jason James Greaving
(74) *Attorney, Agent, or Firm* — Rabin & Berdo, P.C.

(57) ABSTRACT

An electric circuit in which a first switching element and a first diode element are connected in antiparallel to form an upper arm and a second semiconductor element and a second diode element are connected in antiparallel to form a lower arm, and the upper arm and the lower arm are connected in series. A gate current path in one of the upper and lower arms and a reverse recovery path in the other one of the upper and lower arms are disposed close enough and extend at least partially in parallel to each other, so as to generate mutual inductance by the reverse recovery current flowing through the reverse recovery path and the gate current flowing through the gate current path.

17 Claims, 12 Drawing Sheets

MODULE

CROSS REFERENCE TO RELATED APPLICATIONS

This is a continuation application of International Application PCT/JP2021/002005 filed on Jan. 21, 2021 which claims priority from a Japanese Patent Application No. 2020-048329 filed on Mar. 18, 2020, the contents of which are incorporated herein by reference.

BACKGROUND OF THE INVENTION

Technical Field

The present invention relates to an electric circuit and a semiconductor module.

Background Art

Semiconductor devices have a substrate on which semiconductor elements such as an insulated-gate bipolar transistor (IGBT), a power metal-oxide-semiconductor field-effect transistor (power MOSFET), and a free-wheeling diode (FWD) are provided, and are used in apparatus such as inverters.

For example, Patent Literature 1 and 2 have been proposed as semiconductor devices provided with such semiconductor elements. Patent Literature 1 discloses a configuration in which a gate current path and a main current path of an IGBT are disposed in parallel with the current flowing in opposite directions. Patent Literature 1 has an effect of increasing the gate current through mutual induction by the main current when turning on.

Also, Patent Literature 2 discloses a configuration in which the gate wiring and the source wiring of a MOSFET are magnetically coupled. Patent Literature 2 has an effect of preventing a phenomenon that occurs when a switching element in one of either the upper or lower arm turns on, in which a short current (current in the opposite direction) flows to a FWD of the other switching element and causes self-turn-on by the other switching element.

CITATION LIST

Patent Literature

Patent Literature 1: International Publication No. WO 2017/199580
Patent Literature 2: Japanese Patent Laid-Open No. 2011-188540

SUMMARY OF THE INVENTION

Meanwhile, in a configuration in which two combinations of an IGBT element and a FWD element connected in antiparallel (also referred to as arms) are connected in series (also referred to as an upper arm and a lower arm), typically circuits are formed by current paths such that the arms do not influence each other easily, and are disposed in locations where the circuits do not influence each other easily.

As the basic operations of such an IGBT module, first,
(1) When turning on the IGBT element in one of the arms, a current flows from a power source to the IGBT element and is supplied to a load (L load).
(2) When turning off the IGBT element, a current flows back between the FWD element in the other arm and the load (L load).
(3) When turning on the IGBT element again, the operation in (1) is resumed, and at the same time, carriers stored as a depletion layer at the PN junction of the FWD element are released between the FWD element in the other arm and the load (L load), and a large current (also referred to as a reverse recovery current) flows instantaneously in the reverse direction of the FWD element (forward direction of the IGBT element).

Thereafter, the operations of (1) to (3) above are repeated.

During the above switching operations, a current flows instantaneously in a state where there is a potential difference, and therefore loss may occur (switching loss). To reduce the switching loss, improvements such as faster switching speeds are being developed. On the other hand, if sudden voltage variations occur due to excessively fast switching, there are concerns that electromagnetic radiation noise will occur and exert an adverse influence, such as causing malfunctions in peripheral circuits.

The sudden voltage variations described above can be reduced by setting a large gate resistance ($R_G$). However, if a large $R_G$ is set, the switching speed is slowed in the region where the voltage variations are not sudden, thereby increasing the switching loss.

The present invention has been devised in the light of such points, and one objective thereof is to provide an electric circuit and a semiconductor module capable of suppressing electromagnetic radiation noise while also suppressing an increase in switching loss by lowering the switching speed in the current region where the voltage variations are sudden and not lowering the switching speed excessively in the current region where the voltage variations are not sudden.

In an electric circuit according to one aspect of the present invention, a semiconductor element forming an upper arm and another semiconductor element forming a lower arm are connected in series, wherein a gate current path of one arm of either the upper arm or the lower arm and a reverse recovery current path of the other arm are disposed close to each other in parallel, and a direction of the gate current path is the same as a direction of the reverse recovery current path.

In a semiconductor module according to another aspect of the present invention, a semiconductor element forming an upper arm and another semiconductor element forming a lower arm are connected in series, wherein a control wiring member forming a gate current path of one arm of either the upper arm or the lower arm and a main current wiring member forming a reverse recovery current path of the other arm are disposed close to each other in parallel, and a direction of the gate current path is the same as a direction of the reverse recovery current path.

According to the present invention, it is possible to suppress electromagnetic radiation noise while also suppressing an increase in loss during switching.

DESCRIPTION OF THE INVENTION

Figure 1A:
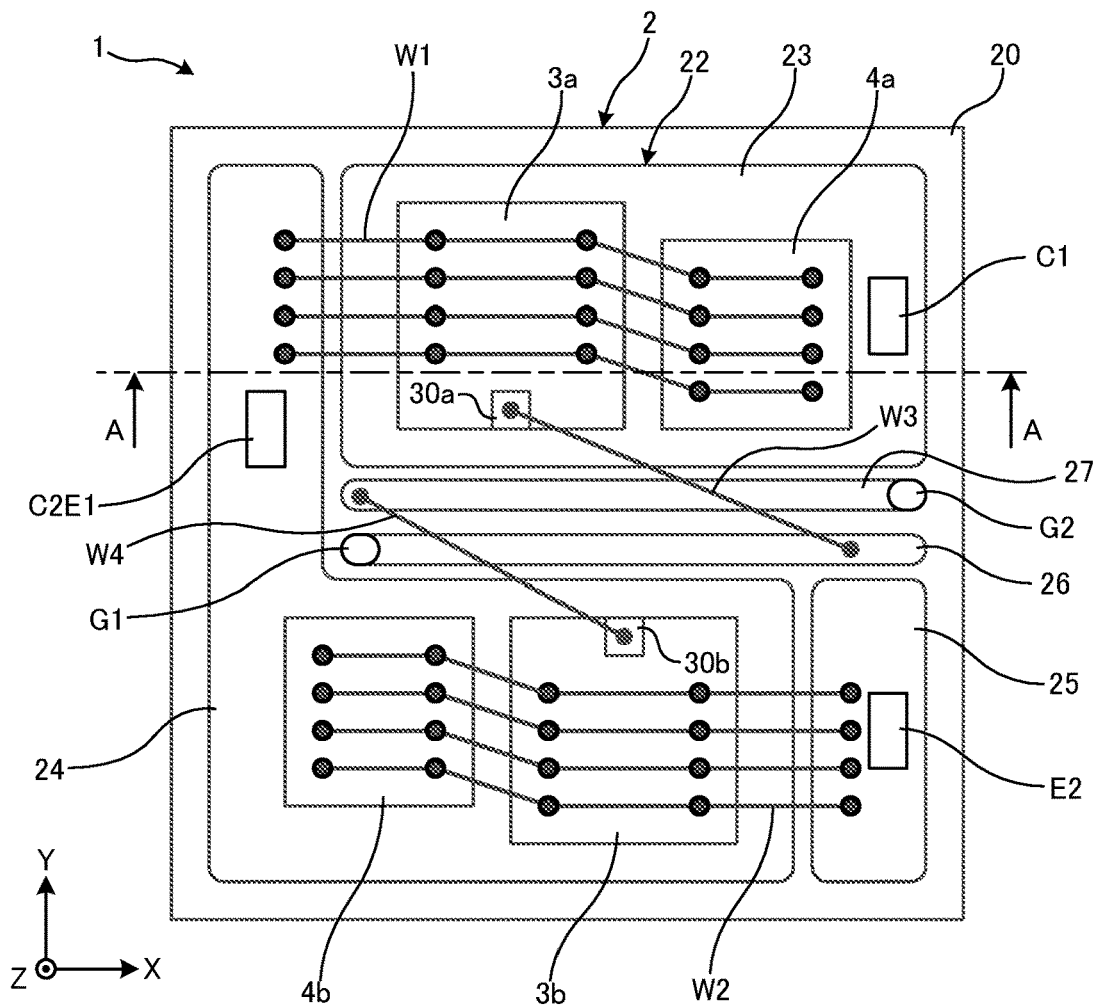
FIG. 1A is a schematic diagram of a semiconductor module according to an embodiment.
Figure 1B:
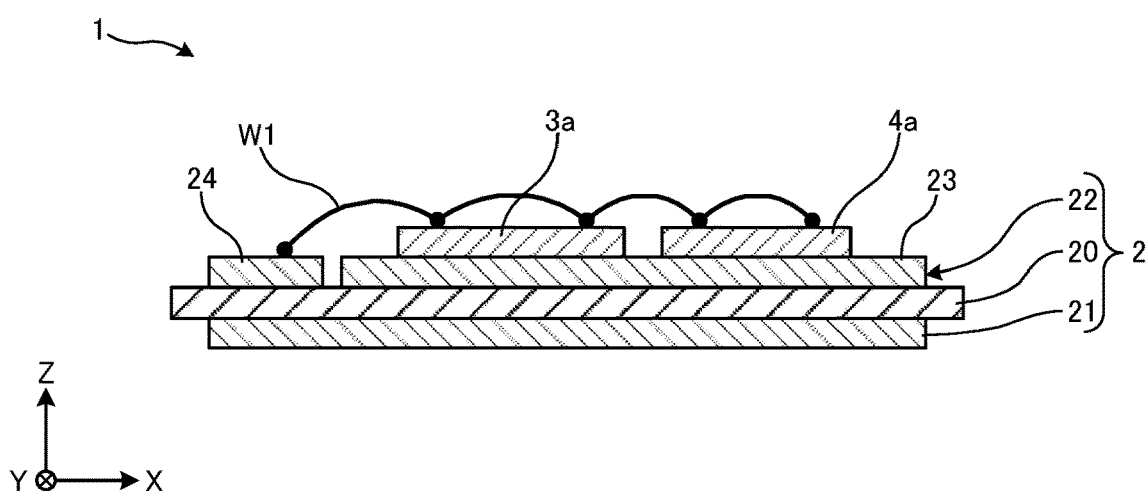
FIG. 1B is a cross-sectional view of the semiconductor module in FIG. 1A.

Hereinafter, a semiconductor module to which the present invention can be applied will be described. FIG. 1 is a schematic diagram of a semiconductor module according to the present embodiment. FIG. 1A is a plan view of the semiconductor module, and FIG. 1B is a cross section cut along the line A-A of the semiconductor module illustrated in FIG. 1A. Note that the semiconductor module illustrated below is merely one non-limiting example, and may be modified appropriately.

Also, in the following diagrams, the X direction is defined as the arrangement direction of a switching element and a diode element connected in parallel, the Y direction is defined as the arrangement direction of the upper arm and the lower arm connected in series, and the Z direction is defined as the height direction of the semiconductor module. The illustrated X, Y, and Z axes are orthogonal to each other and constitute a right-handed coordinate system. Additionally, in some cases, the X direction may be referred to as the left-right direction, the Y direction as the front-back direction, and the Z direction as the up-down direction. These directions (front-back, left-right, and up-down directions) are terms used for convenience in the description, and depending on the installed attitude of the semiconductor device, the correspondence relationships between these directions and the XYZ directions may change. For example, the surface on the heat-dissipating side (cooler side) of the semiconductor device is referred to as the bottom face, while the opposite side is referred to as the top face. Also, in this specification, a plan view means the case of viewing the top face of the semiconductor device from the positive Z direction.

The semiconductor device according to the present embodiment is applied to a power conversion device such as a power module, for example, and is a power module that forms an inverter circuit. The semiconductor device is provided with a semiconductor module 1. FIGS. 1A and 1B will be referenced to describe a single semiconductor module 1. For example, in the case where the semiconductor device forms a three-phase inverter circuit, three semiconductor modules like that of FIGS. 1A and 1B are arranged in the order of U phase, V phase, W phase.

As illustrated in FIGS. 1A and 1B, the semiconductor module 1 includes a laminated substrate 2, and a plurality of switching elements 3a, 3b and a plurality of diode elements 4a, 4b disposed on the laminated substrate 2. Note that in FIGS. 1A and 1B, components such as a case member housing the above configuration and an encapsulating resin are omitted from illustration for convenience.

The laminated substrate 2 is formed by stacking metal layers and insulating layers, and includes a direct copper bonding (DCB) substrate, an active metal brazing (AMB) substrate, or a metal base substrate, for example. Specifically, the laminated substrate 2 includes an insulating plate 20, a heatsink 21 disposed on the bottom face of the insulating plate 20, and a plurality of circuit boards 22 disposed on the top face of the insulating plate 20. The laminated substrate 2 is formed into a substantially square shape in a plan view, for example.

The insulating plate 20 has a predetermined thickness in the Z direction, and is formed into a tabular shape having a top face and a bottom face. The insulating plate 20 is formed by a ceramic material such as alumina ($Al_2O_3$), aluminum nitride (AlN), or silicon nitride ($Si_3N_4$), a resin material such as epoxy, or an insulating material such as an epoxy resin using a ceramic material as a filler, for example. Note that the insulating plate 20 may also be referred to as an insulating layer or an insulating film.

The heatsink 21 has a predetermined thickness in the Z direction, and is formed so as to cover the entire bottom face of the insulating plate 20. The heatsink 21 is formed by a metal plate with favorable thermal conductivity, such as copper or aluminum, for example.

On the top face (main face) of the insulating plate 20, the plurality of circuit boards 22 are formed as islands that are electrically insulated from each other. Specifically, the plurality of circuit boards 22 includes a first circuit board 23 connected to a positive potential point (P terminal), a second circuit board 24 connected to an intermediate potential point (M terminal), a third circuit board 25 connected to a negative potential point (N terminal), and a pair of gate wiring circuit boards 26 and 27. These circuit boards 22 contain a metal layer of predetermined thickness formed by copper foil or the like.

The first circuit board 23 has a rectangular shape in a plan view extending in the X direction. The first circuit board 23 is disposed off-center on the positive Y side of the insulating plate 20. Although described in detail later, the switching element 3a and the diode element 4a forming the upper arm are disposed on the top face of the first circuit board 23. A pad C1 for external connection, to which a collector electrode of the upper arm is connected, is disposed on the positive X end of the first circuit board 23. The pad C1 is connected to the positive potential point (P terminal) of an external power source.

The second circuit board 24 has a main portion (rectangular portion) disposed off-center on the negative Y side, and the negative X end of the rectangular portion protrudes at a right angle in the positive Y direction to form substantially an L shape in a plan view. Although described in detail later, the switching element 3b and the diode element 4b forming the lower arm are disposed on the top face of the rectangular portion of the second circuit board 24 in the X direction. Also, a pad C2E1 for external connection, to which a collector electrode of the lower arm and an emitter electrode of the upper arm are connected, is disposed on the elongated part of the second circuit board 24 extending in the Y direction. The elongated part is positioned farther on the negative X side than the first circuit board 23. The pad C2E1 is connected to an external load that acts as the intermediate potential point (M terminal).

The third circuit board 25 is disposed in the corner on the positive X side and the negative Y side of the insulating plate 20. The third circuit board 25 is disposed farther on the negative X side than the rectangular portion of the second circuit board 24, and has a rectangular shape long in the Y direction that is substantially the same width as the rectangular portion of the second circuit board 24. A pad (second external connection terminal) E2 for external connection, to which an emitter electrode of the lower arm is connected, is disposed on the third circuit board 25. The pad E2 is connected to the negative potential point (N terminal) of an external power source.

The gate wiring circuit board 26 forms a first control wiring member that electrically connects a gate electrode 30a of the switching element 3a forming the upper arm to a pad G1 of an external connection terminal (first external connection terminal) for inputting the gate signal of the upper arm. The gate wiring circuit board 27 forms a second control wiring member that electrically connects a gate electrode 30b of the switching element 3b forming the lower arm to a pad G2 of an external connection terminal (third external connection terminal) for inputting the gate signal of the lower arm. The pair of gate wiring circuit boards 26 and 27 are formed as members elongated in the X direction, located centrally in the Y direction of the insulating plate 20. The gate wiring circuit board 26 extends parallel to the arrangement direction of the switching element 3a and the diode element 4a (X direction). The gate wiring circuit board 27 extends parallel to the arrangement direction of the switching element 3b and the diode element 4b (X direction).

The pair of gate wiring circuit boards 26 and 27 are disposed in between the first circuit board 23 and the rectangular portion of the second circuit board 24. Also, the pair of gate wiring circuit boards 26 and 27 are arranged in the Y direction. One, namely the gate wiring circuit board 26, is positioned on the negative Y side and the other, namely the gate wiring circuit board 27, is positioned on the positive Y side.

In other words, the gate wiring circuit board 26 is disposed near the lower arm (near the second circuit board 24), and is close to the switching element 3b and the diode element 4b. Also, the gate wiring circuit board 27 is disposed near the upper arm (near the first circuit board 23), and is close to the switching element 3a and the diode element 4a.

Additionally, the pad G1 for external connection is disposed on the negative X end of the gate wiring circuit board 26. Although described in detail later, the gate electrode 30a of the upper arm is connected to the gate wiring circuit board 26 (pad G1) through a control wire W3. Similarly, the pad G2 for external connection is disposed on the positive X end of the gate wiring circuit board 27. The gate electrode 30b of the lower arm is connected to the gate wiring circuit board 27 (pad G2) through a control wire W4. In other words, the gate wiring circuit board 26 forms a gate wiring for the upper arm, and the gate wiring circuit board 27 forms a gate wiring for the lower arm.

As described above, a plurality of semiconductor elements (switching elements and diode elements) are disposed through a bonding material such as solder (not illustrated) at predetermined locations on the top faces of the circuit boards 22. The semiconductor elements are formed having a square shape in a plan view by a semiconductor substrate such as silicon (Si), silicon carbide (SiC), or gallium nitride (GaN), for example. In the present embodiment, a switching element and a diode element are connected in antiparallel to form an arm.

Specifically, on the top face of the first circuit board 23, the switching element 3a and the diode element 4a are arranged in the X direction. The switching element 3a is positioned on the negative X side and the diode element 4a is positioned on the positive X side. The switching element 3a and the diode element 4a are connected in antiparallel and form the upper arm.

Similarly, on the top face of the second circuit board 24, the switching element 3b and the diode element 4b are arranged in the X direction. The switching element 3b is positioned on the positive X side and the diode element 4b is positioned on the negative X side. The switching element 3b and the diode element 4b are connected in antiparallel and form the lower arm. Note that the arrangement direction of the switching element 3a and the diode element 4a is the opposite of the arrangement direction of the switching element 3b and the diode element 4b.

The switching elements may be an IGBT, a power MOSFET, or a bipolar junction transistor (BJT), for example. The diode elements may be a free-wheeling diode (FWD), a Schottky barrier diode (SBD), a junction barrier Schottky (JBS) diode, a merged PN Schottky (MPS) diode, or a PN diode, for example.

Note that in the present embodiment, semiconductor elements are formed by combining the above switching elements and diode elements, but the semiconductor elements are not limited thereto and may be changed appropriately. The semiconductor elements may also be a reverse-conducting IGBT (RC-IGBT) combining the functions of an IGBT element and an FWD element, for example. Also, the semiconductor elements may be a MOSFET element provided with a body diode. If the semiconductor elements are an RC-IGBT or a MOSFET element provided with a body diode, the switching element and the diode element can be configured as a single semiconductor element. Also, properties such as the shape, number, and placement of the semiconductor elements are not limited to the above description and may be changed appropriately. For example, a plurality of switching elements may be connected in parallel. A plurality of diode elements may also be connected in parallel.

As described above, the switching element 3a and the diode element 4a positioned on the first circuit board 23 form the upper arm, while the switching element 3b and the diode element 4b positioned on the second circuit board 24 form the lower arm. In other words, the upper arm and the lower arm are arranged in the Y direction.

On a semiconductor substrate having a first face and a second face on the opposite side from the first face, these semiconductor elements may be provided with an emitter, a source, or an anode on the first face disposed as the top face, and a collector, a drain, or a cathode on the second face disposed as the bottom face. The switching element 3a (3b) is provided with the gate electrode 30a (30b) on the first face.

The top face of each semiconductor element and a predetermined circuit board 22 are electrically connected by a main current wiring member. Specifically, the switching element 3a and the diode element 4a are electrically connected to the elongated part of the second circuit board 24 through a main current wire W1. The main current wire W1 forms a first main current wiring member that electrically connects the switching element 3a and the diode element 4a forming the upper arm to the switching element 3b and the diode element 4b forming the lower arm. Specifically, the switching element 3a and the diode element 4a are electrically connected to the second circuit board 24 on which the switching element 3b and the diode element 4b are mounted by what is called stitch bonding, in which bonding is performed consecutively at a plurality of bonding points without cutting the wire at each bonding point. A main current wire W2 forms a second main current wiring member that electrically connects the switching element 3b and the diode element 4b forming the lower arm to the pad E2 connected to external connection terminal on the negative electrode side. Specifically, the switching element 3b and the diode element 4b are electrically connected to the third circuit board 25 on which the pad E2 is formed by stitch bonding through the main current wire W2.

Also, the gate electrode 30a of the switching element 3a forming a part of the upper arm is electrically connected to the gate wiring circuit board 26 through the control wire W3. One end of the control wire W3 is connected to the gate electrode 30a, and the other end of the control wire W3 is connected to positive X end of the gate wiring circuit board 26. Similarly, the gate electrode 30b of the switching element 3b forming a part of the lower arm is electrically connected to the gate wiring circuit board 27 through the control wire W4. One end of the control wire W4 is connected to the gate electrode 30b, and the other end of the control wire W4 is connected to negative X end of the gate wiring circuit board 27.

Conductor wires (bonding wires) are used as these wires. Gold, copper, aluminum, gold alloy, copper alloy, and aluminum alloy can be used either singly or in combination with each other as the material of the conductor wires. Additionally, it is also possible to use members other than conductor wires as the wiring members. For example, ribbons or a lead frame can be used instead of wires. Also, although described in detail later, the main current wiring members may also be configured as a metal wiring plate.

In this way, the upper arm and the lower arm are connected in series by the main current wire W1 and the second circuit board 24. More specifically, the emitter electrode of the upper arm (switching element 3a) and the collector electrode of the lower arm (switching element 3b) are connected in series on the second circuit board 24.

Figure 2A:
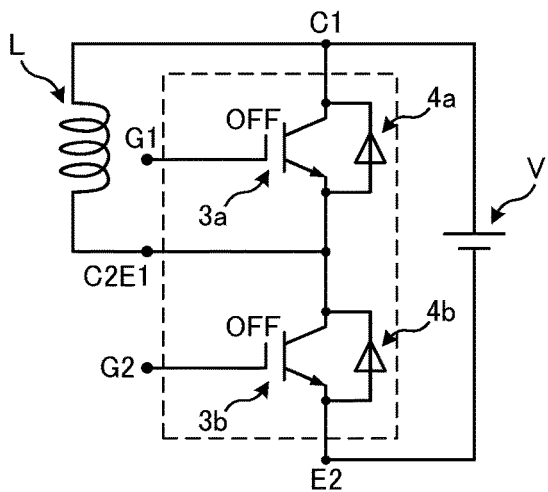
FIGS. 2A-2E are circuit diagrams illustrating switching operations in a structure of the related art.
Figure 2B:
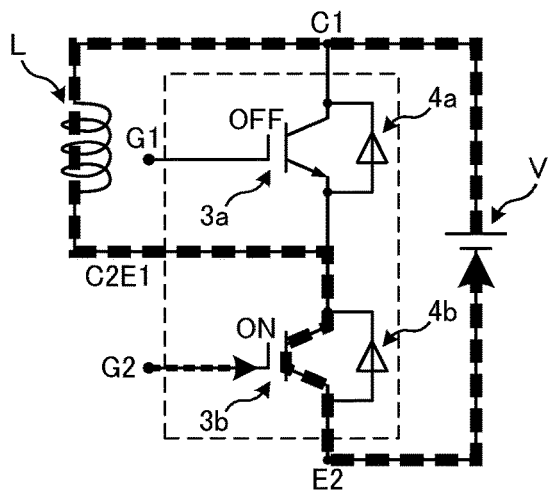
Figure 2C:
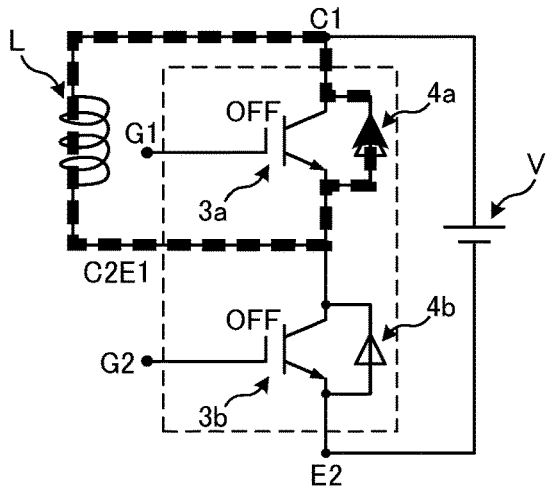
Figure 2D:
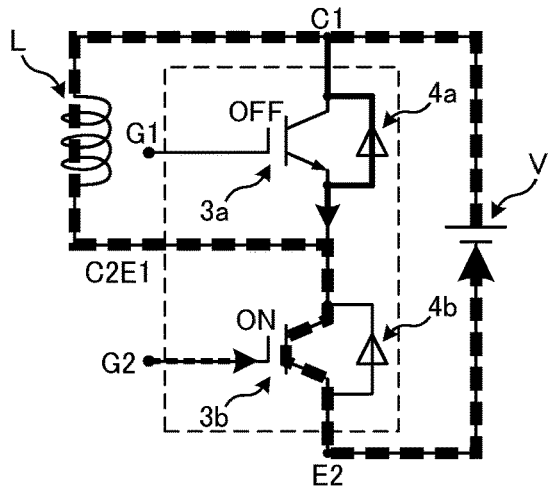
Figure 2E:
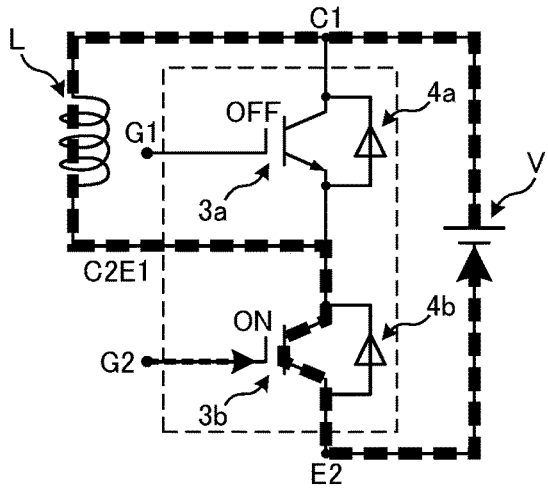
Figure 3A:
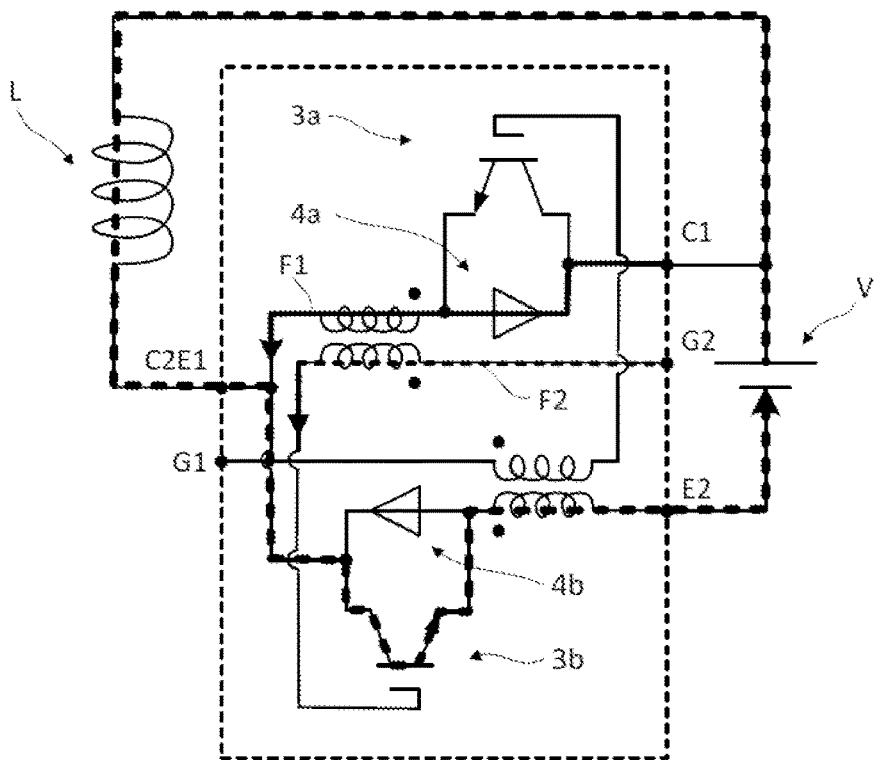
FIGS. 3A an 3B are schematic diagrams illustrating an electric circuit according to the present embodiment.
Figure 3B:
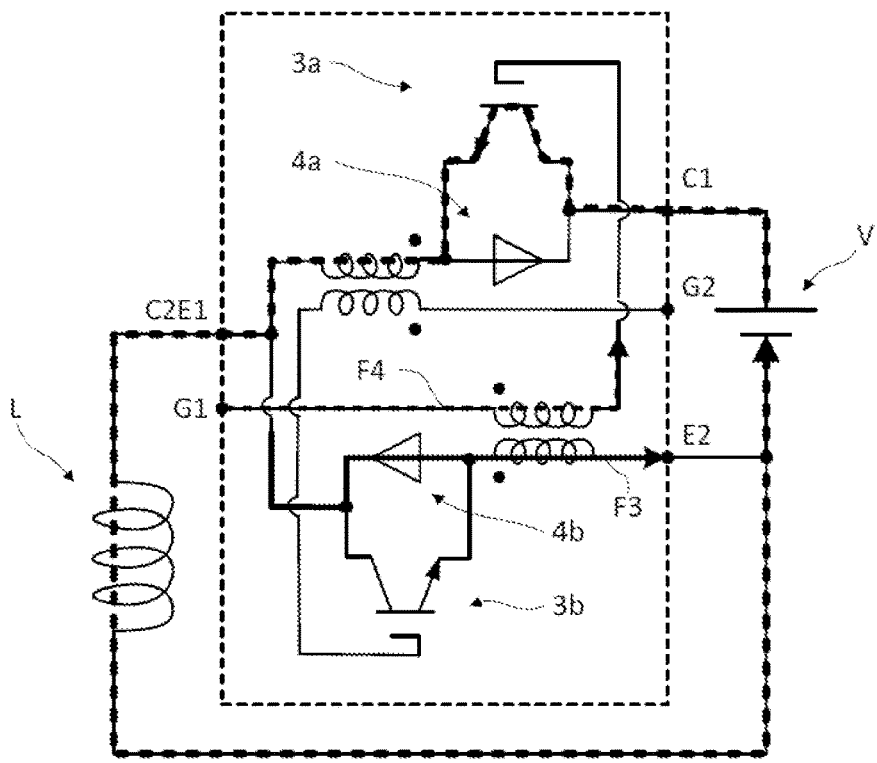

Here, FIGS. 2A-2E and 3A and 3B will be referenced to describe the basic operations of the semiconductor module provided with a configuration in which two combinations of a switching element and a diode element connected in antiparallel are connected in series (upper arm and lower arm). FIGS. 2A-2E are a circuit diagram illustrating switching operations in a structure of the related art. FIG. 2A illustrates an initial state in which the switching elements 3a and 3b of the upper and lower arms are both turned off, and FIG. 2B illustrates a state in which the switching element 3b of the lower arm is turned on. FIG. 2C illustrates a state immediately after the switching element 3b of the lower arm is turned off, and FIG. 2D illustrates a state immediately after the switching element 3b of the lower arm is turned on again. FIG. 2E illustrates a steady state after a predetermined time has elapsed since the switching element 3b of the lower arm was turned on. FIGS. 3A and 3B are a schematic diagram illustrating an electric circuit according to the present embodiment. FIG. 3A illustrates the current path when the lower arm is driven, and illustrates a state immediately after the switching element 3b of the lower arm is turned on, similarly to FIG. 2D. FIG. 3B illustrates the current path when the upper arm is driven, and illustrates a state immediately after the switching element 3a of the upper arm is turned on, similarly to (symmetrical with) FIG. 3A. Note that because the circuit configurations illustrated in FIGS. 2A-2E and 3A and 3B correspond to the configuration in FIGS. 1A and 1B, portions already described above are denoted with the same signs, and further description is omitted. Also, although FIGS. 2A-2E are used to describe an example of the case of turning the lower arm on and off, similar (symmetrical) behavior is assumed to occur in the upper arm, too.

As illustrated in FIG. 2A, a power source V is disposed between the P terminal (pad C1) and the N terminal (pad E2). Also, an inductance L (hereinafter referred to as the load L) exists as a load between the P terminal and the M terminal (pad C2E1).

As illustrated in FIG. 2B, if a gate current flows from an external control driver to the gate of the switching element 3b of the lower arm through the pad G2 of an external connection terminal for inputting the gate signal and the switching element 3b of the lower arm is turned on, the current flows through the load L and also through the switching element 3b.

Additionally, as illustrated in FIG. 2C, if the gate current from the external control driver stops and the switching element 3b is switched off, the current flows back between the diode element 4a of the upper arm and the load L.

Thereafter, as illustrated in FIG. 2D, if a gate current flows again from the external control driver to the gate of the switching element 3b and the switching element 3b is turned on again, not only does a current flow through the load L and the switching element 3b, but a current in the reverse direction (reverse recovery current) flows through the diode element 4a of the upper arm.

Additionally, as illustrated in FIG. 2E, if a predetermined time elapses and a steady state is achieved, a current flow only through the load L and the switching element 3b, similarly to FIG. 2B.

In this way, because a reverse recovery current occurs in the diode element 4a of the upper arm in FIG. 2D, the current flows through not only the load L but also the upper arm and is lost. Furthermore, sudden voltage variations may occur, and radiation noise may occur.

Accordingly, the inventor focused on the directions and positional relationship between the wiring connecting the upper and lower arms or the wiring connecting the lower arm and the power source V and the gate wiring in the lower arm or the upper arm, and thereby conceived of the present invention. Specifically, as illustrated in FIGS. 3A and 3B, in the electric circuit according to the present embodiment, the switching element 3a (first switching element) and the diode element 4a (first diode element) are connected in antiparallel to form the upper arm, the switching element 3b (second switching element) and the diode element 4b (second diode element) are connected in antiparallel to form the lower arm, and the upper and lower arms are connected in series.

In particular, as illustrated in FIG. 3A, a wiring F1 connecting the upper and lower arms and a gate wiring F2 of the lower arm are disposed close to each other in parallel, and electromagnetic induction is generated by mutual inductance. Also, the direction of the current flowing through the gate wiring F2 of the lower arm is the same as the direction of the reverse recovery current flowing from the diode element 4a of the upper arm toward the lower arm.

According to this configuration, in the case where the switching element 3b of the lower arm is turned on in a state where a current is flowing back to the diode element 4a of the upper arm (the state from FIG. 2C to FIG. 2D), as illustrated in FIG. 3A, the reverse recovery current due to the diode element 4a of the upper arm flows through the wiring F1 acting as a reverse recovery current path in the direction from right to left on the page. At this time, a gate current flows in the same direction (from right to left) as the reverse recovery current through the wiring F2 acting as a gate current path at a location near the wiring F1 acting as the reverse recovery current path.

With this arrangement, electromagnetic induction is generated by mutual inductance between the wiring F1 and the wiring F2, and the gate current of the lower arm is suppressed by the induced electromotive force generated by the reverse recovery current of the upper arm. As a result, the reverse recovery current settles due to a slowdown of the switching speed, thereby suppressing sudden voltage variations until a steady state is achieved. In other words, the loss due to the reverse recovery current can be suppressed. Furthermore, excessively rapid switching operations can be restrained, making it possible to reduce the occurrence of radiation noise.

Similarly, as illustrated in FIG. 3B, a wiring F3 connecting the lower arm and the power source V and a gate wiring F4 of the upper arm are disposed close to each other at least partially in parallel, and thus electromagnetic induction is generated by mutual inductance. Also, the direction of the current flowing through the gate wiring F4 of the upper arm is the same as the direction of the reverse recovery current flowing from the diode element 4b of the lower arm toward the power source V.

According to this configuration, in the case where the switching element 3a of the upper arm is turned on in a state where a current is flowing back to the diode element 4b of the lower arm, as illustrated in FIG. 3B, the reverse recovery current due to the diode element 4b of the lower arm flows through the wiring F3 acting as a reverse recovery current path in the direction from left to right on the page. At this time, a gate current flows in the same direction (from left to right) as the reverse recovery current through the wiring F4 acting as a gate current path at a location near the wiring F3 acting as the reverse recovery current path.

With this arrangement, electromagnetic induction is generated by mutual inductance between the wiring F3 and the wiring F4, and the gate current of the upper arm is suppressed by the induced electromotive force generated by the reverse recovery current of the lower arm. As a result, the reverse recovery current settles due to a slowdown of the switching speed, thereby suppressing sudden voltage variations until a steady state is achieved. In other words, the loss due to the reverse recovery current can be suppressed. Furthermore, excessively rapid switching operations can be restrained, making it possible to reduce the occurrence of radiation noise.

Figure 4:
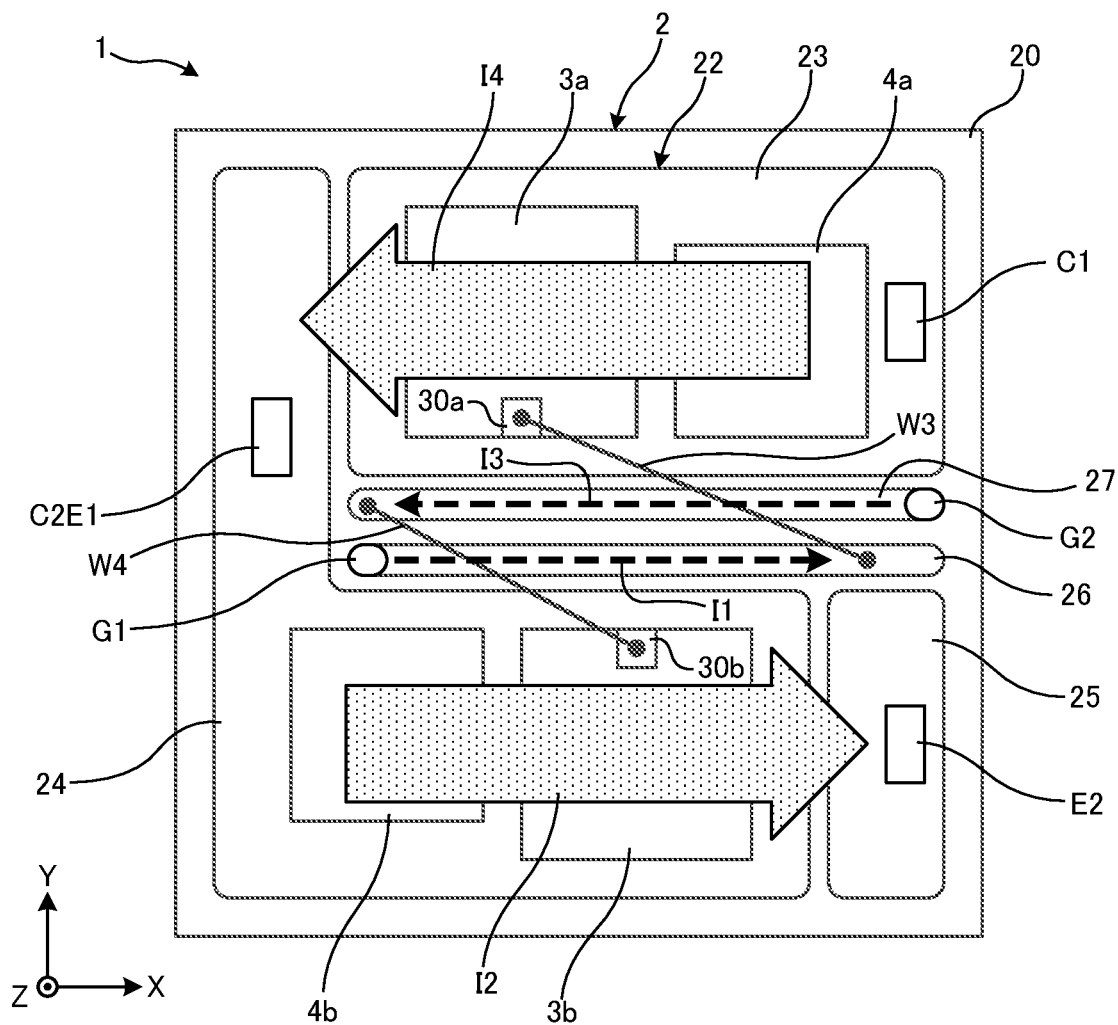
FIG. 4 is a plan view of a semiconductor module illustrating the flow of current according to the present embodiment.

Next, FIG. 4 will be referenced to describe the flow of current in a semiconductor module to which the electric circuit according to the present embodiment has been applied. FIG. 4 is a plan view of a semiconductor module illustrating the flow of current according to the present embodiment. Note that in FIG. 4, the main current wiring members in FIG. 1 are omitted for convenience.

As illustrated in FIG. 4, the switching element 3a and the diode element 4a forming the upper arm are arranged in the X direction on the first circuit board 23. The switching element 3b and the diode element 4b forming the lower arm are arranged in the X direction on the second circuit board 24. Also, the main current wire W2 (second main current wiring member; see FIGS. 1A and 1B) that electrically connects the switching element 3b and the diode element 4b extends parallel to the arrangement direction of the switching element 3b and the diode element 4b. Furthermore, the gate wiring circuit board 26 (first gate wiring circuit board) electrically connected to the gate electrode 30a of the switching element 3a is disposed adjacently extending in parallel with the main current wire W2. A gate current I1 flowing through the gate wiring circuit board 26 flows in the same direction as a reverse recovery current I2 flowing through the main current wire W2.

According to this configuration, in the case where the switching element 3a of the upper arm is turned on in a state where a current is flowing back to the diode element 4b of the lower arm, the gate current I1 flows from the external control driver, enters the pad G1 of an external connection terminal for inputting the gate signal, and flows from the pad G1 to the gate electrode 30a of the switching element 3a of the upper arm through the gate wiring circuit board 26 and the control wire W3. At the same time, the reverse recovery current I2 due to the diode element 4b of the lower arm flows from the pad C2E1 for connecting the intermediate terminal, through the second circuit board 24, the diode element 4b, and the main current wire W2 (see FIG. 1A) to the pad E2 for connecting the negative electrode external connection terminal. Here, the gate wiring circuit board 26 acting as the gate current path and the main current wire W2 acting as the reverse recovery current path are disposed adjacently extending in parallel (see FIG. 1A). Moreover, the gate current I1 and the reverse recovery current I2 flow in the same direction (positive X direction). By disposing these two current paths close to each other in the same direction, electromagnetic induction is generated by mutual inductance, and the gate current I1 of the upper arm is suppressed by the induced electromotive force generated by the reverse recovery current I2. As a result, the reverse recovery current settles due to a slowdown of the switching speed, thereby suppressing sudden voltage variations until a steady state is achieved.

Also, the main current wire W1 (first main current wiring member; see FIGS. 1A and 1B) that electrically connects the switching element 3a and the diode element 4a extends parallel to the arrangement direction of the switching element 3a and the diode element 4a. Furthermore, the gate wiring circuit board 27 (second gate wiring circuit board) electrically connected to the gate electrode 30b of the switching element 3b is disposed adjacently extending in parallel with the main current wire W1. A gate current I3 flowing through the gate wiring circuit board 27 flows in the same direction as a reverse recovery current I4 flowing through the main current wire W1.

According to this configuration, in the case where the switching element 3b of the lower arm is turned on in a state where a current is flowing back to the diode element 4a of the upper arm, the gate current I3 flows from the external control driver, enters the pad G2 of an external connection terminal for inputting the gate signal, and flows from the pad G2 to the gate electrode 30b of the switching element 3b of the lower arm through the gate wiring circuit board 27 and the control wire W4. At the same time, the reverse recovery current I4 due to the diode element 4a of the upper arm flows from the pad C1 for connecting the positive electrode external connection terminal, through the first circuit board 23, the diode element 4a, and the main current wire W1 (see FIG. 1A) to the pad C2E1 for connecting the intermediate terminal. Here, the gate wiring circuit board 27 acting as the gate current path and the main current wire W1 acting as the reverse recovery current path are disposed adjacently extending in parallel (see FIG. 1A). Moreover, the gate current I3 and the reverse recovery current I4 flow in the same direction (negative X direction). By disposing these two current paths close to each other in the same direction, electromagnetic induction is generated by mutual inductance, and the gate current I3 of the lower arm is suppressed by the induced electromotive force generated by the reverse recovery current I4. As a result, the reverse recovery current settles due to a slowdown of the switching speed, thereby suppressing sudden voltage variations until a steady state is achieved. According to this configuration, the gate currents I1 and I3 of the upper and lower arms flow in opposite directions, and the reverse recovery currents I2 and I4 of the upper and lower arms flow in opposite directions.

Also, in the present embodiment, the first circuit board 23 and the rectangular part of the second circuit board 24 are disposed with the gate wiring circuit boards 26 and 27 in-between in the direction (Y direction) intersecting the extension direction (X direction). The gate wiring circuit board 26 is disposed on the side near the second circuit board 24, and the gate wiring circuit board 27 is disposed on the side near the first circuit board 23.

Also, the gate wiring circuit board 26 preferably has a length equal to or greater than the width in the arrangement direction of the switching element 3b and the diode element 4b. Similarly, the gate wiring circuit board 27 preferably has a length equal to or greater than the width in the arrangement direction of the switching element 3a and the diode element 4a.

This configuration makes it possible to further raise the effect of suppressing the gate current I1 (I3) due to the induced electromotive force of the reverse recovery current I2 (I4). In other words, in a configuration combining a switching element and a diode element, by providing a gate current path of a length corresponding to the width of these two types of elements, it is possible to suppress the gate current more effectively.

Figure 5A:
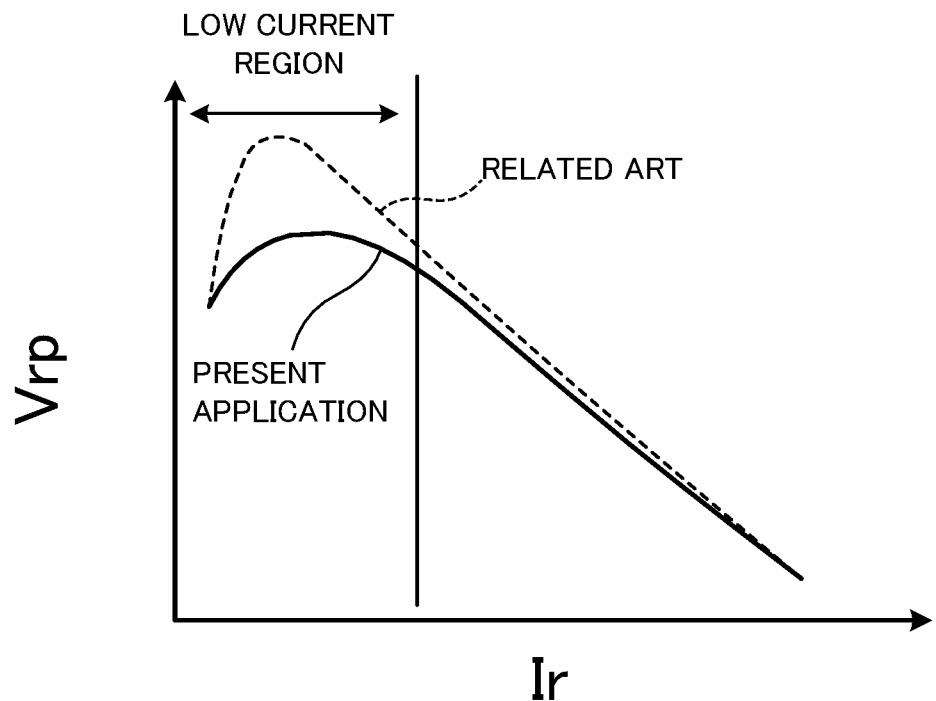
FIGS. 5A and 5B are graphs illustrating the voltage surge and the voltage change with respect to the current.
Figure 5B:
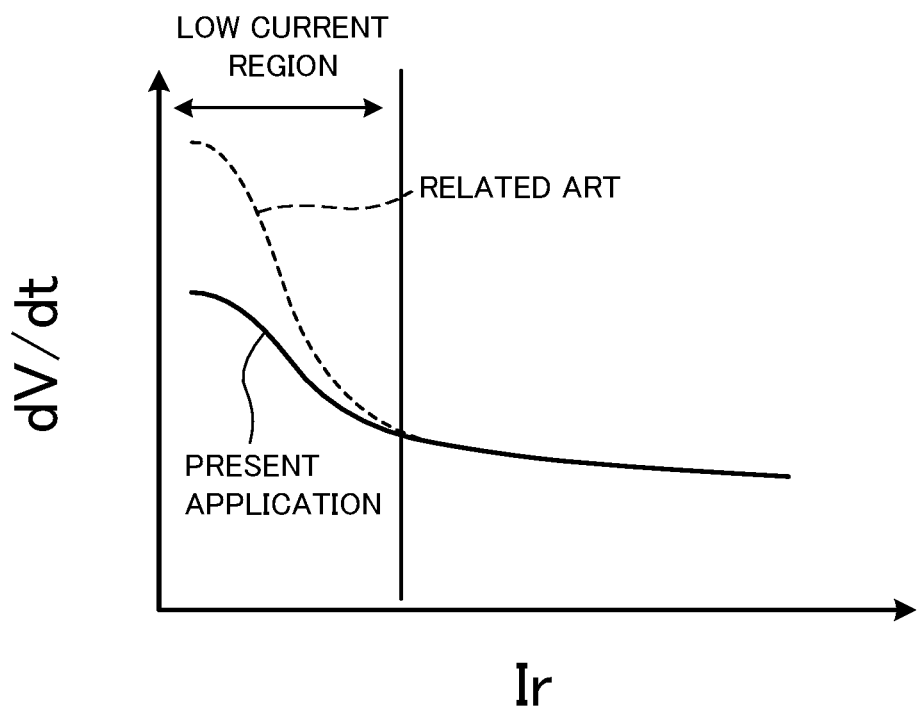

Here, FIGS. 5A and 5B will be referenced to describe the current dependency of voltage surges and voltage changes due to reverse recovery. FIGS. 5A and 5B are graphs illustrating the voltage surge and the voltage change with respect to the current. More specifically, FIG. 5A illustrates the voltage surge Vrp (vertical axis) with respect to the current Ir (horizontal axis), and FIG. 5B illustrates the rate of voltage change dV/dt (vertical axis) with respect to the current Ir (horizontal axis). Also, in FIGS. 5A and 5B, the dashed-line graphs illustrate an example of the related art, and the solid-line graphs illustrate an example of the present disclosure.

As illustrated in FIGS. 5A and 5B, the related art has a property in which the voltage surge Vrp and the rate of voltage change dV/dt changes suddenly in association with enabling faster switching of the semiconductor module, particularly in a certain low-current region. With this arrangement, there are concerns that radiation noise will be generated and exert influence, such as causing malfunctions in peripheral circuits. To reduce the radiation noise, it is conceivable to reduce the switching speed with the gate resistance $R_G$. However, there is a problem in that raising the gate resistance $R_G$ greatly increases the switching loss.

In other words, because the gate resistance $R_G$ is a resistance that may affect the module as a whole, controlling the switching speed with the gate resistance $R_G$ as in the related art affects the entire current domain. For example, if the gate resistance $R_G$ is increased to reduce the switching speed in a low-current region, the switching speed will be slowed throughout the entire current domain, and the switching loss will increase greatly.

The present invention adopts the configuration described earlier to exhibit an effect of suppressing loss to the extent that the switching speed is sudden. Consequently, a loss suppression effect that pinpoints a predetermined region (low-current region) can be heightened without changing the gate resistance $R_G$, making it possible to suppress the dulling of the switching speed and increased loss in the comparatively high-current region other than the low-current region. Here, the low-current region described above is preferably 20% or less of the rated current of the module.

As described above, in the present embodiment, by disposing a reverse recovery current path for the diode elements and the gate current path for the switching elements on the driving side in a pair of arms close to each other and in the same direction, the switching speed can be reduced in a current region where voltage variations are sudden. Furthermore, in a current region where voltage variations are not sudden, it is possible to suppress loss during switching without excessively slowing the switching speed.

Figure 6A:
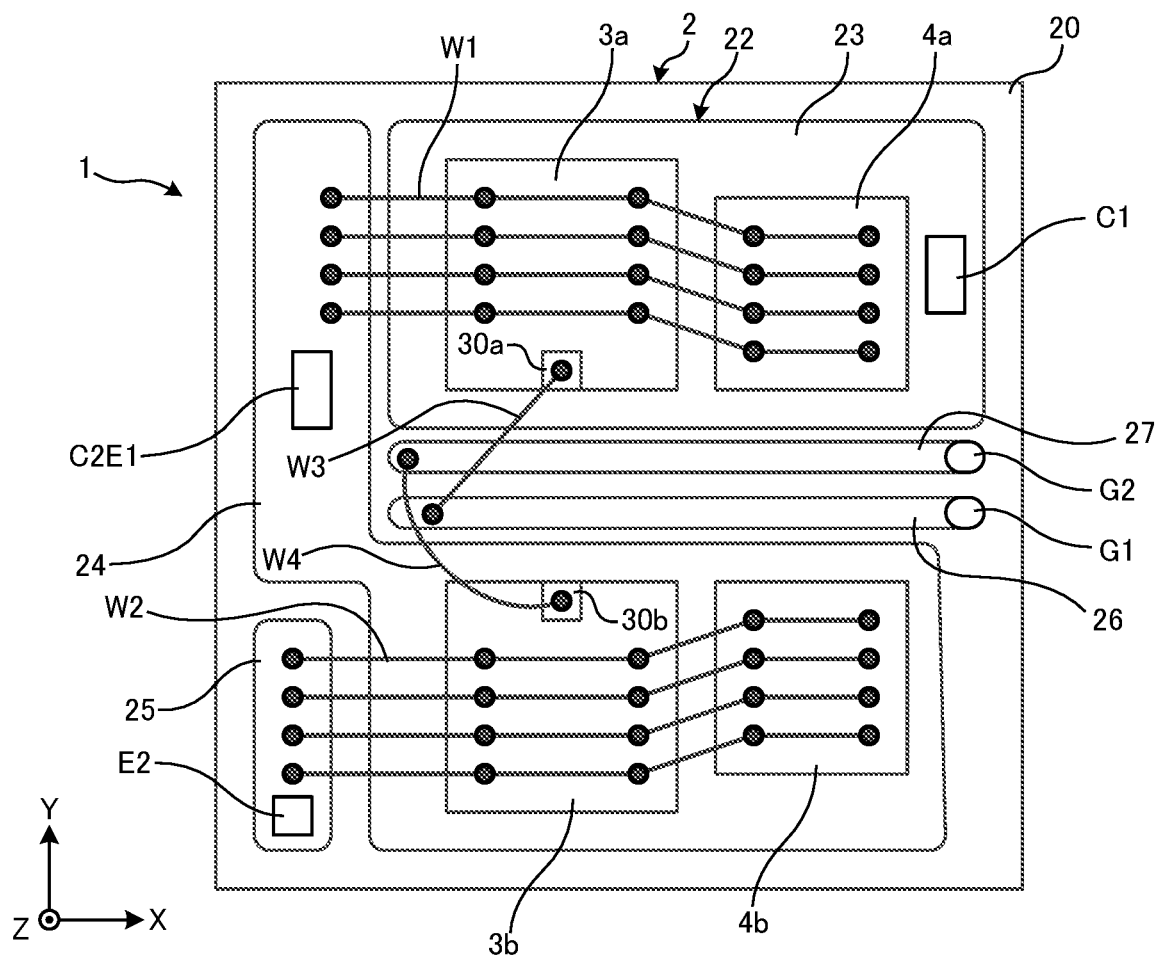
FIGS. 6A and 6B are schematic diagrams of a semiconductor module according to a first modification.
Figure 6B:
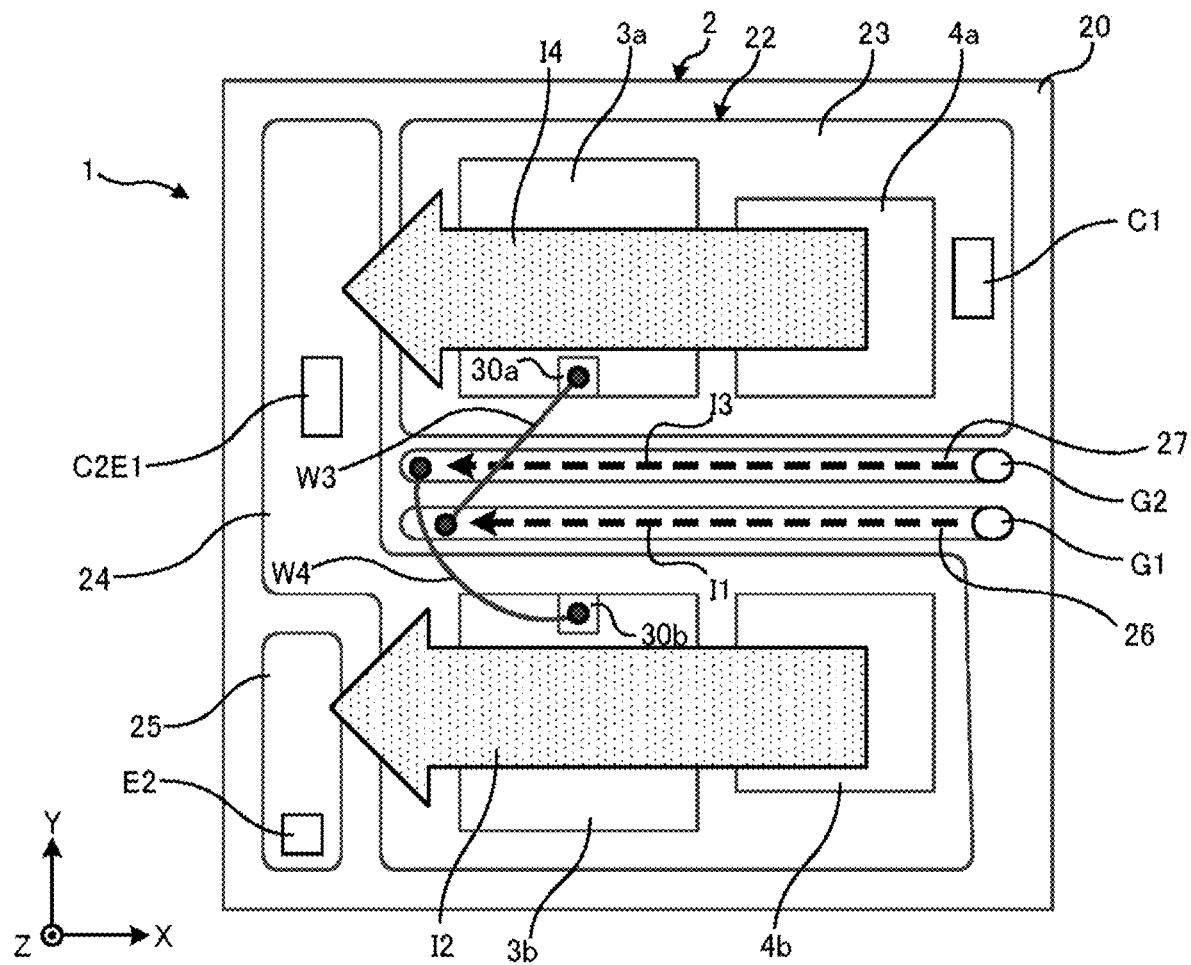
Figure 7A:
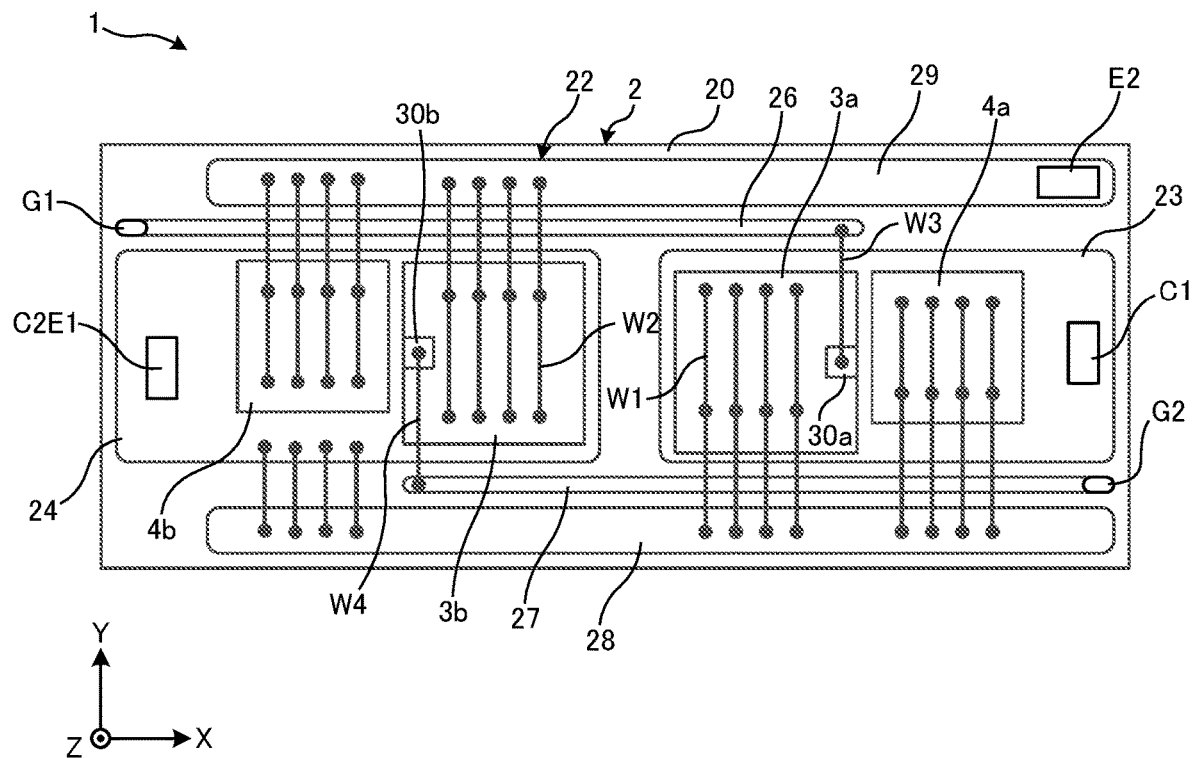
FIGS. 7A and 7B are schematic diagrams of a semiconductor module according to a second modification.
Figure 7B:
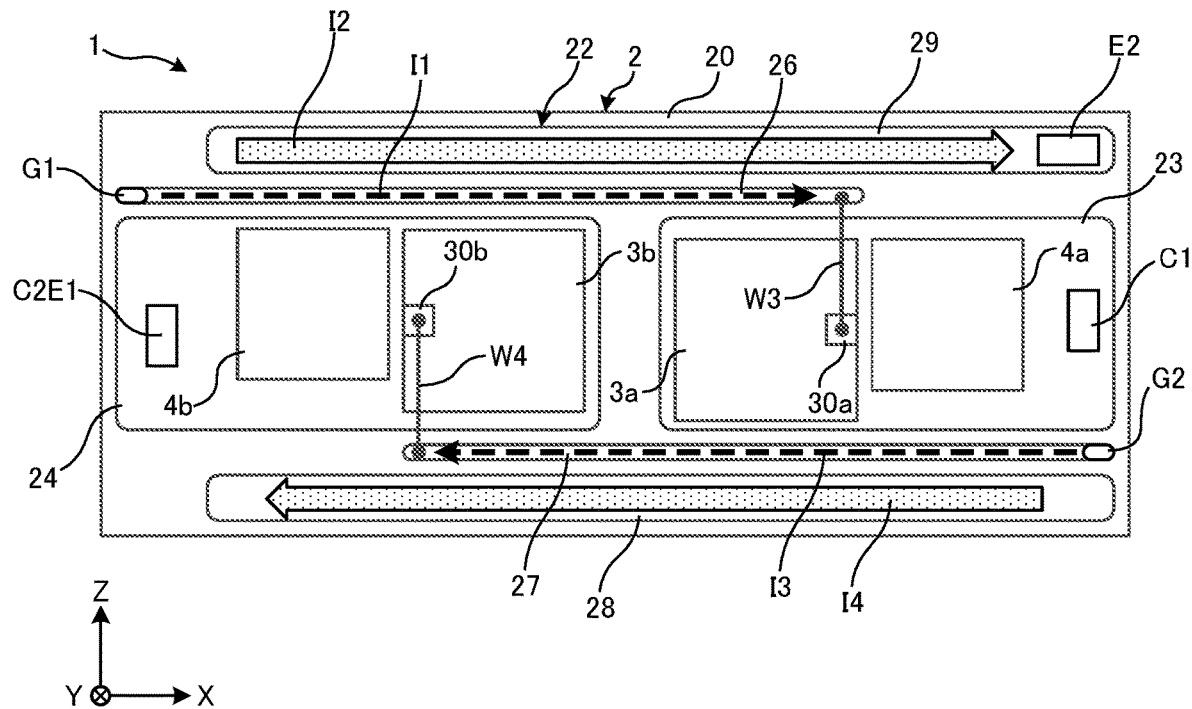
Figure 8A:
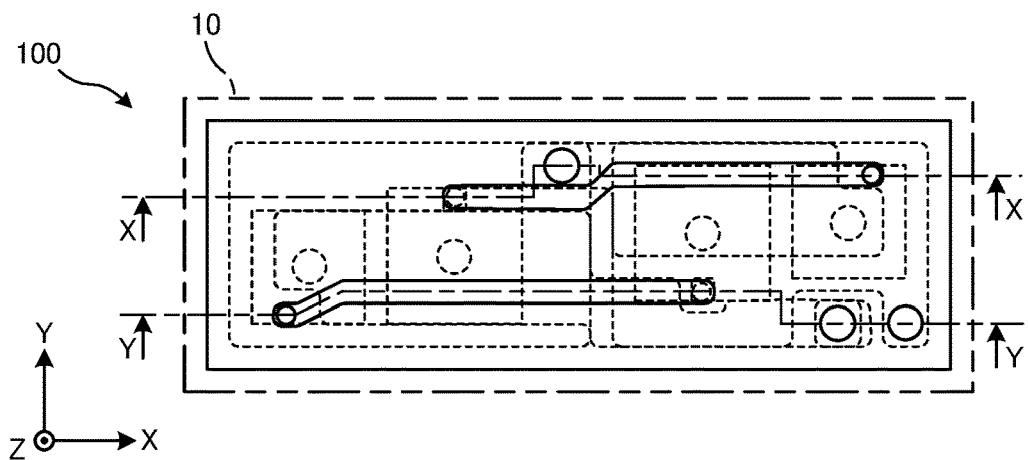
FIG. 8A is a schematic diagram of a semiconductor module according to a third modification.
Figure 9A:
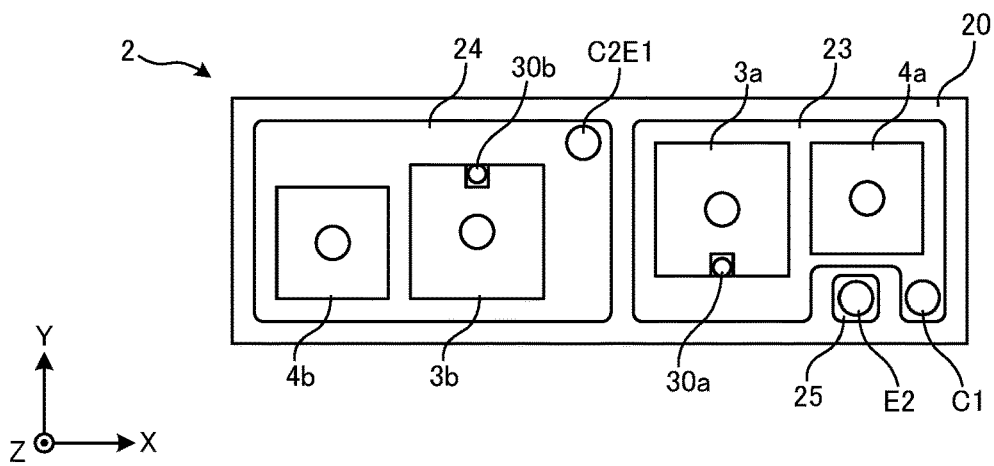
FIGS. 9A-9C are schematic diagrams of a semiconductor module according to the third modification.
Figure 9B:
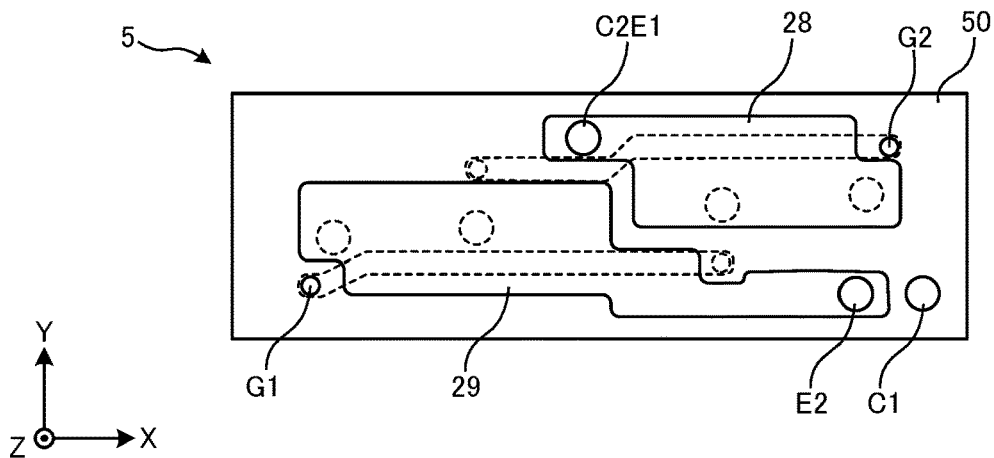
Figure 9C:
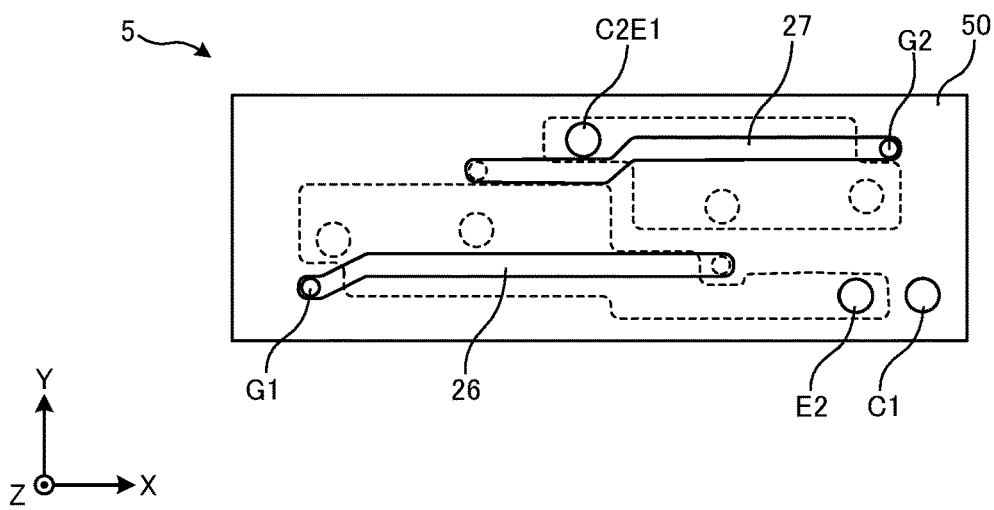
Figure 10:
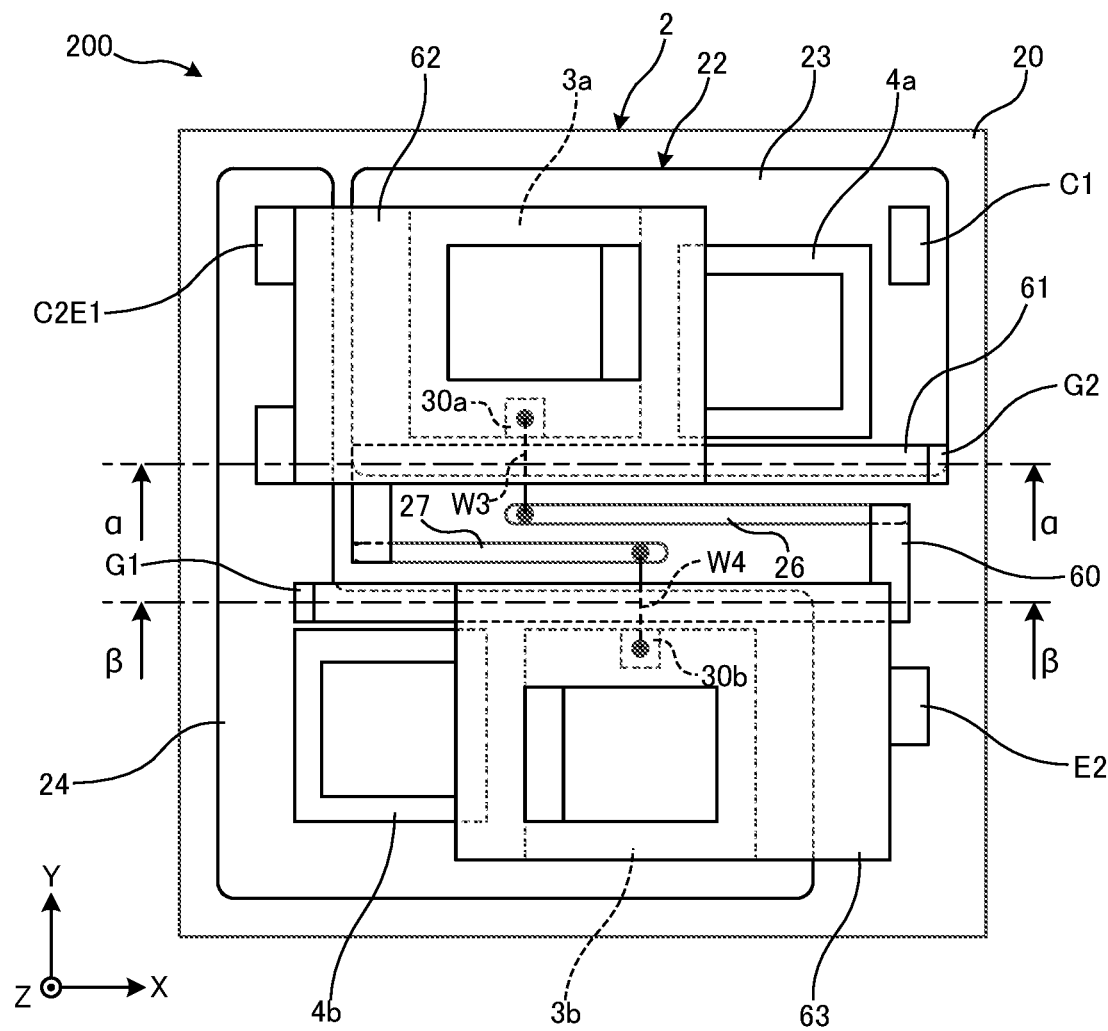
FIG. 10 is a schematic diagram of a semiconductor module according to a fourth modification.

Next, modifications will be described with reference to FIGS. 6A to 11B. FIGS. 6A and 6B are schematic diagrams of a semiconductor module according to a first modification. FIGS. 7A and 7B are schematic diagrams of a semiconductor module according to a second modification. FIGS. 8A and 9C are schematic diagrams of a semiconductor module according to a third modification. FIGS. 10 and 11B are schematic diagrams of a semiconductor module according to a fourth modification. In all of the following modifications, the reverse recovery current path for the diode elements and the gate current path for the switching elements on the driving side in a pair of arms are disposed close to each other and in the same direction, similarly to the above embodiment. In other words, the gate current I1 flows at a position close to the reverse recovery current path of the lower arm and in the same direction as the reverse recovery current I2, and the gate current I3 flows at a position close to the reverse recovery current path of the upper arm and in the same direction as the reverse recovery current I4. With this arrangement, the switching speed can be reduced in the current region where voltage variations are sudden. Furthermore, in a current region where voltage variations are not sudden, it is possible to suppress loss during switching without excessively slowing the switching speed. Note that in the following modifications, only the differences will be described mainly, and portions already described will be denoted with the same signs and omitted from further description where appropriate.

The above embodiment describes a case in which the arrangement order of the switching element 3a and the diode element 4a in the X direction is the reverse of the arrangement order of the switching element 3b and the diode element 4b, but the embodiment is not limited to this configuration. For example, the configuration illustrated in FIGS. 6A and 6B is also possible.

As illustrated in FIGS. 6A and 6B, the arrangement order of the switching element 3a and the diode element 4a in the X direction is the same as the arrangement order of the switching element 3b and the diode element 4b. More specifically, a portion of the corner of the L-shaped second circuit board 24 in a plan view is cut away. The third circuit board 25 is disposed in the cutaway portion. On the second circuit board 24, the switching element 3b is disposed on the negative X side and the diode element 4b is disposed on the positive X side. Also, the other end of the control wire W3 is connected to the negative X end of the gate wiring circuit board 26. Also, the pad G1 is disposed on the positive X end of the gate wiring circuit board 26. According to this configuration, the pads G1 and G2 of external connection terminals for inputting the gate signals are both disposed on the same end (in FIG. 6A, the positive X end), thereby simplifying the wiring from the external control driver.

According to this configuration, the gate wiring circuit board 26 that acts as the gate current path of the upper arm and the main current wire W2 that acts as the reverse recovery current path of the lower arm are disposed adjacently extending in parallel. Additionally, in the case where the switching element 3a of the upper arm is turned on in a state where a current is flowing back to the diode element 4b of the lower arm, the gate current I1 of the upper arm and the reverse recovery current I2 of the lower arm flow in the same direction (negative X direction). For this reason, electromagnetic induction is generated by mutual inductance, and the switching speed can be reduced in the current region where voltage variations are sudden. Furthermore, in a current region where voltage variations are not sudden, it is possible to suppress loss during switching without excessively slowing the switching speed.

Also, according to this configuration, the gate wiring circuit board 27 that acts as the gate current path of the lower arm and the main current wire W1 that acts as the reverse recovery current path of the upper arm are disposed adjacently extending in parallel. Additionally, in the case where the switching element 3b of the lower arm is turned on in a state where a current is flowing back to the diode element 4a of the upper arm, the gate current I3 of the lower arm and the reverse recovery current I4 of the upper arm flow in the same direction (negative X direction). For this reason, electromagnetic induction is generated by mutual inductance, and the switching speed can be reduced in the current region where voltage variations are sudden. Furthermore, in a current region where voltage variations are not sudden, it is possible to suppress loss during switching without excessively slowing the switching speed. According to this configuration, the gate currents I1 and I3 of the upper and lower arms as well as the reverse recovery currents I2 and I4 of the upper and lower arms all flow in the same direction (negative X direction) as in FIGS. 6A and 6B.

Also, the above embodiment describes a case where the first circuit board 23 and the second circuit board 24 are arranged in the Y direction, but the embodiment is not limited to this configuration. For example, the configuration illustrated in FIGS. 7A and 7B is also possible.

As illustrated in FIGS. 7A and 7B, the first circuit board 23 and the second circuit board 24 are arranged in the arrangement direction of the switching element 3a and the diode element 4a or the arrangement direction of the switching element 3b and the diode element 4b (X direction). On the first circuit board 23, the switching element 3a is positioned on the negative X side and the diode element 4a is positioned on the positive X side. On the second circuit board 24, the switching element 3b is positioned on the positive X side and the diode element 4b is positioned on the negative X side. In other words, the switching elements 3a and 3b are positioned on the inner side of the module, with the diode elements 4a and 4b on either side.

The gate wiring circuit boards 26 and 27 are formed in an elongated shape extending in the X direction, with the first circuit board 23 and the second circuit board 24 in between in the Y direction. The gate wiring circuit board 26 is positioned on the positive Y side and the gate wiring circuit board 27 is positioned on the negative Y side.

Also, in FIGS. 7A and 7B, main current wiring circuit boards 28 and 29 as main current wiring members are disposed on the insulating plate 20. The main current wiring circuit boards 28 and 29 are formed in an elongated shape extending in the X direction, with the gate wiring circuit boards 26 and 27 in between in the Y direction. The main current wiring circuit board 28 is disposed adjacently to the gate wiring circuit board 27 on the negative Y side of the gate wiring circuit board 27. The main current wiring circuit board 29 is disposed adjacently to the gate wiring circuit board 26 on the positive Y side of the gate wiring circuit board 26.

The main current wiring circuit board 28 is electrically connected to the switching element 3a and the diode element 4a through the main current wire W1. The main current wiring circuit board 29 is electrically connected to the switching element 3b and the diode element 4b through the main current wire W2.

According to this configuration, the gate wiring circuit board 26 that acts as the gate current path of the upper arm and the main current wiring circuit board 29 that acts as the reverse recovery current path of the lower arm are disposed adjacently extending in parallel. Additionally, in the case where the switching element 3a of the upper arm is turned on in a state where a current is flowing back to the diode element 4b of the lower arm, the gate current I1 of the upper arm and the reverse recovery current I2 of the lower arm flow in the same direction (positive X direction). For this reason, electromagnetic induction is generated by mutual inductance, and the switching speed can be reduced in the current region where voltage variations are sudden. Furthermore, in a current region where voltage variations are not sudden, it is possible to suppress loss during switching without excessively slowing the switching speed.

Also, according to this configuration, the gate wiring circuit board 27 that acts as the gate current path of the lower arm and the main current wiring circuit board 28 that acts as the reverse recovery current path of the upper arm are disposed adjacently extending in parallel. Additionally, in the case where the switching element 3b of the lower arm is turned on in a state where a current is flowing back to the diode element 4a of the upper arm, the gate current I3 of the lower arm and the reverse recovery current I4 of the upper arm flow in the same direction (negative X direction). For this reason, electromagnetic induction is generated by mutual inductance, and the switching speed can be reduced in the current region where voltage variations are sudden. Furthermore, in a current region where voltage variations are not sudden, it is possible to suppress loss during switching without excessively slowing the switching speed. According to this configuration, the gate currents I1 and I3 of the upper and lower arms flow in opposite directions, and the reverse recovery currents I2 and I4 of the upper and lower arms flow in opposite directions.

Also, the above embodiment describes a case where the gate wiring circuit boards 26 and 27 and the main current wiring circuit boards 28 and 29 are formed on the single insulating plate 20, but the embodiment is not limited to this configuration. For example, the configuration illustrated in FIGS. 8A-9C is also possible. The configuration of FIGS. 8A-9C differs from the above in that an auxiliary board 5 for wiring is provided above the laminated substrate 2 (main board).

Figure 8B:
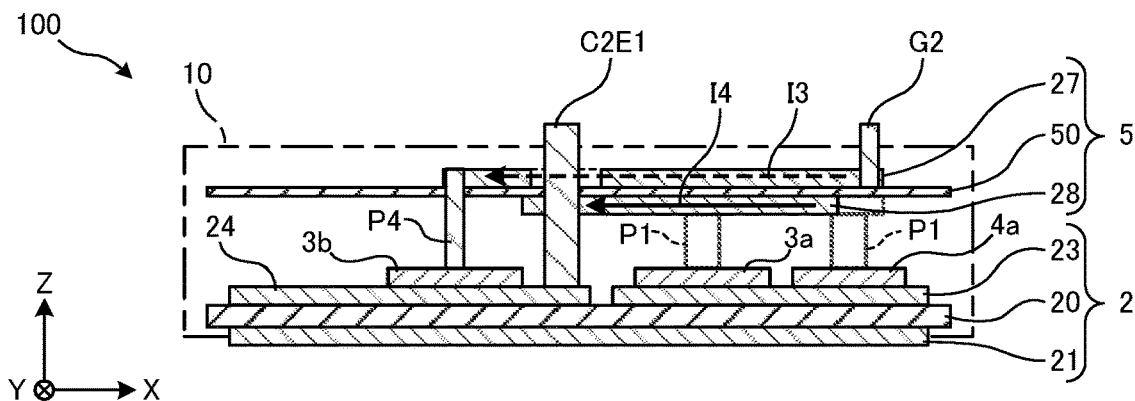
FIGS. 8B and 8C are cross-sectional views of the semiconductor module in FIG. 8A.
Figure 8C:
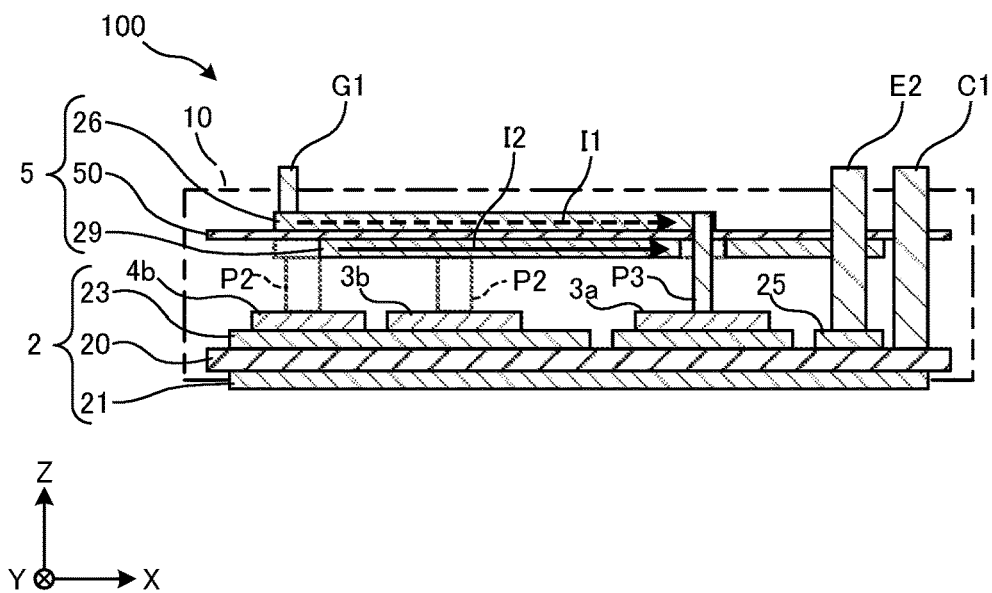

FIG. 8A is a plan view of a semiconductor module 100, FIG. 8B is a cross section cut along the line X-X in FIG. 8A, and FIG. 8C is a cross section cut along the line Y-Y in FIG. 8A. FIG. 9A is a plan view of a state in which semiconductor elements are disposed on the main board, FIG. 9B is a plan view as seen from above the bottom face (B face) of the auxiliary board, and FIG. 9C is a plan view as seen from above the top face (A face) of the auxiliary board. Note that in FIGS. 8A-9C, the pads are replaced with external connection terminals.

As illustrated in FIGS. 8A-9C, in the semiconductor module 100, the auxiliary board 5 for current wiring is disposed above the laminated substrate 2. The semiconductor elements disposed on the laminated substrate 2 and the auxiliary board 5 are encapsulated by an encapsulating resin 10. The first circuit board 23, the second circuit board 24, and the third circuit board 25 are formed on the top face of the insulating plate 20.

The auxiliary board 5 includes an insulating plate 50, the gate wiring circuit boards 26 and 27 formed on the top face of the insulating plate 20, and the main current wiring circuit boards 28 and 29 (main current wiring members) formed on the bottom face of the insulating plate 20. The auxiliary board 5 is formed into a substantially rectangular shape in a plan view corresponding to the laminated substrate. The auxiliary board 5 may be formed using a printed circuit board, for example.

The switching element 3a and the diode element 4a are electrically connected to the main current wiring circuit board 28 through a columnar connecting pin P1 extending in the Z direction. The switching element 3b and the diode element 4b are electrically connected to the main current wiring circuit board 29 through a columnar connecting pin P2 extending in the Z direction.

The gate electrode 30a of the switching element 3a is electrically connected to the gate wiring circuit board 26 through a columnar connecting pin P3 extending in the Z direction. The gate electrode 30b of the switching element 3b is electrically connected to the gate wiring circuit board 27 through a columnar connecting pin P4 extending in the Z direction.

The external connection terminals C2E1, C1, and E2 have a columnar shape extending in the Z direction. The lower end of the external connection terminal C2E1 is electrically connected to the second circuit board 24, and the upper end projects upward to penetrate through the main current wiring circuit board 28. The lower end of the external connection terminal C1 is electrically connected to the first circuit board 23, and the upper end projects upward to penetrate through the insulating plate 50. The lower end of the external connection terminal E2 is electrically connected to the third circuit board 25, and the upper end projects upward to penetrate through the main current wiring circuit board 29.

As illustrated in FIG. 8C, according to this configuration, the gate wiring circuit board 26 that acts as the gate current path of the upper arm and the main current wiring circuit board 29 that acts as the reverse recovery current path of the lower arm are disposed adjacently on the auxiliary board 5 and extend in parallel with the insulating plate 50 in between. Additionally, in the case where the switching element 3a of the upper arm is turned on in a state where a current is flowing back to the diode element 4b of the lower arm, the gate current I1 of the upper arm and the reverse recovery current I2 of the lower arm flow in the same direction (positive X direction).

Also, as illustrated in FIG. 8B, according to this configuration, the gate wiring circuit board 27 that acts as the gate current path of the lower arm and the main current wiring circuit board 28 that acts as the reverse recovery current path of the upper arm are disposed adjacently on the auxiliary board 5 and extend in parallel with the insulating plate 50 in between. Additionally, in the case where the switching element 3b of the lower arm is turned on in a state where a current is flowing back to the diode element 4a of the upper arm, the gate current I3 of the lower arm and the reverse recovery current I4 of the upper arm flow in the same direction (negative X direction).

As above, according to the configuration in FIGS. 8A-9C, the gate current path of one arm and the reverse recovery current path of the other arm are disposed adjacently on the auxiliary board 5 and extend in parallel with the insulating plate 50 in between. For this reason, the gate current path of one arm and the reverse recovery current path of the other arm can be disposed adjacently on opposing planes, and moreover can be brought close to each other at an optimal insulation distance. For this reason, a large electromagnetic induction is generated by mutual inductance, and the switching speed can be reduced more effectively in the current region where voltage variations are sudden. Furthermore, in a current region where voltage variations are not sudden, it is possible to suppress loss during switching without excessively slowing the switching speed.

Figure 11A:
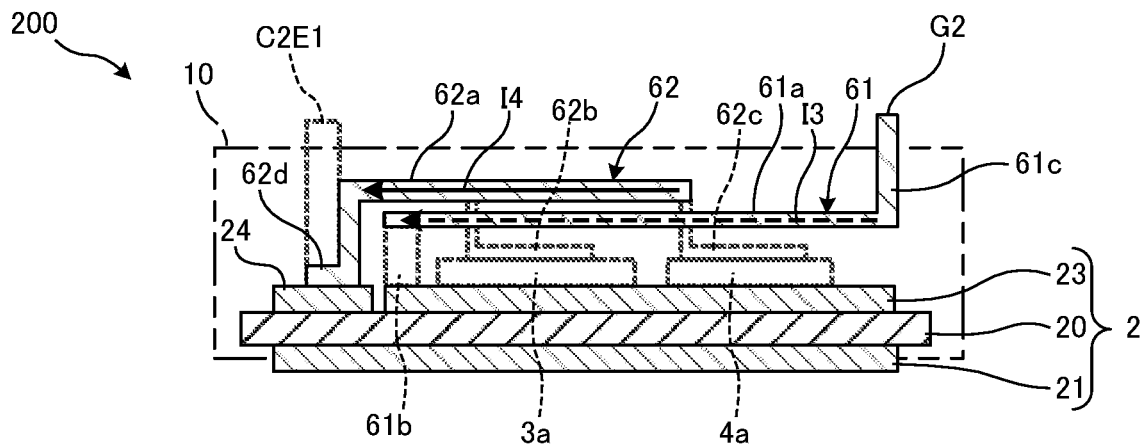
FIGS. 11A and 11B are schematic diagrams of a semiconductor module according to the fourth modification.
Figure 11B:
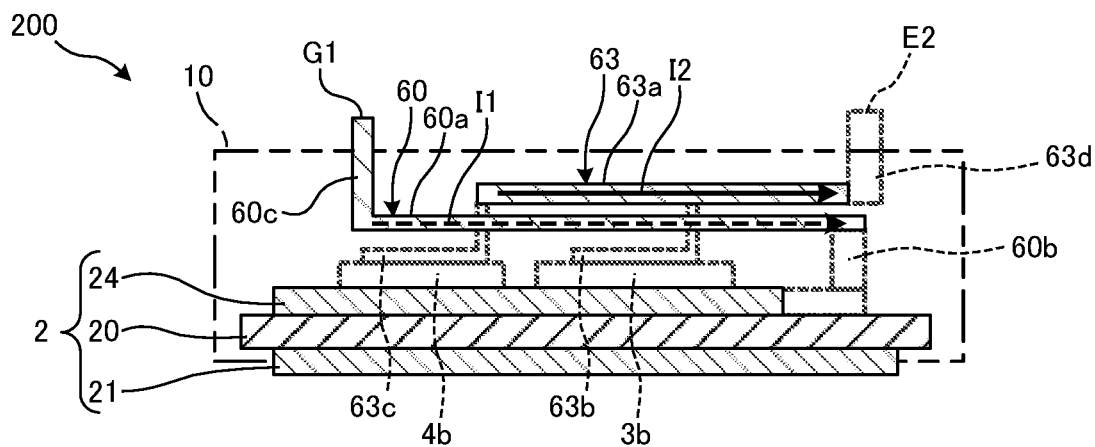

In addition, the configuration in FIGS. 10-11B is also possible. FIG. 11A is a cross section cut along the line α-α in FIG. 10, and FIG. 11B is a cross section cut along the line β-β in FIG. 10. The configuration in FIGS. 10 and 11 differs from the above embodiment in that the gate wiring circuit boards 26 and 27 and the main current wiring circuit boards 28 and 29 are configured by using metal wiring plates 60 to 63 (also referred to as lead frames), each of which is formed independently from the laminated substrate 2.

The metal wiring plates 60 to 63 are formed by a process such as press working using a metal material such as a copper material, a copper alloy material, an aluminum alloy material, or an iron alloy material, for example. Note that the shapes of the metal wiring plates illustrated in FIGS. 10-11B are merely one example, and the shapes may be changed appropriately.

The metal wiring plates 60 and 61 include horizontal parts 60a and 61a extending horizontally in the X direction, first ends 60b and 61b, and second ends 60c and 61c. The first end 60b is electrically connected to the gate wiring circuit board 26. The second end 60c is electrically connected to the external connection terminal G1. The first end 61b is electrically connected to the gate wiring circuit board 27. The second end 61c is electrically connected to the external connection terminal G2.

The metal wiring plates 62 and 63 include horizontal parts 62a and 63a extending horizontally in the X direction, first connecting parts 62b and 63b, second connecting parts 62c and 63c, and third connecting parts 62d and 63d. The first connecting part 62b is electrically connected to the switching element 3a. The second connecting part 62c is electrically connected to the diode element 4a. The third connecting part 62d is electrically connected to the second circuit board 24. The first connecting part 63b is electrically connected to the switching element 3b. The second connecting part 63c is electrically connected to the diode element 4b. The third connecting part 63d is electrically connected to the external connection terminal E2.

As illustrated in FIG. 11B, according to this configuration, the horizontal part 60a of the metal wiring plate 60 that acts as the gate current path of the upper arm and the horizontal part 63a of the metal wiring plate 63 that acts as the reverse recovery current path of the lower arm are disposed adjacently in the Z direction and extend in parallel in the X direction. Additionally, in the case where the switching element 3a of the upper arm is turned on in a state where a current is flowing back to the diode element 4b of the lower arm, the gate current I1 of the upper arm and the reverse recovery current I2 of the lower arm flow in the same direction (positive X direction).

Also, as illustrated in FIG. 11A, according to this configuration, the horizontal part 61a of the metal wiring plate 61 that acts as the gate current path of the lower arm and the horizontal part 62a of the metal wiring plate 62 that acts as the reverse recovery current path of the upper arm are disposed adjacently in the Z direction and extend in parallel in the X direction. Additionally, in the case where the switching element 3b of the lower arm is turned on in a state where a current is flowing back to the diode element 4a of the upper arm, the gate current I3 of the lower arm and the reverse recovery current I4 of the upper arm flow in the same direction (negative X direction).

As above, according to the configuration in FIGS. 10 and 11, the gate current path of one arm and the reverse recovery current path of the other arm are disposed adjacently in the Z direction and extend in parallel in the X direction. For this reason, the gate current path of one arm and the reverse recovery current path of the other arm can be disposed adjacently on opposing planes. For this reason, a large electromagnetic induction is generated by mutual inductance, and the switching speed can be reduced more effectively in the current region where voltage variations are sudden. Furthermore, in a current region where voltage variations are not sudden, it is possible to suppress loss during switching without excessively slowing the switching speed.

Also, in the above embodiment, the number and placement of the semiconductor elements is not limited to the above configuration and may be changed appropriately.

Also, in the above embodiment, the number and layout of circuit boards is not limited to the above configuration and may be changed appropriately.

Also, the above embodiment takes a configuration in which the laminated substrate 2 and the semiconductor elements are formed in a rectangular or square shape in a plan view, but the embodiment is not limited to this configuration. The laminated substrate 2 and the semiconductor elements may also be formed in a polygonal shape other than the above.

In addition, the present embodiment and modifications have been described, but the above embodiment and the modifications may also be combined in full or in part and treated as another embodiment.

Also, the present embodiment is not limited to the above embodiment and modifications, and various modifications, substitutions, and alterations are possible without departing from the scope of the technical idea. Further, if the technical idea can be achieved according to another method through the advancement of the technology or another derivative technology, the technical idea may be implemented using the method. Consequently, the claims cover all embodiments which may be included in the scope of the technical idea.

Features of the above embodiment are summarized below.

In an electric circuit according to the above embodiment, a semiconductor element forming an upper arm and another semiconductor element forming a lower arm are connected in series, wherein a gate current path of one arm of either the upper arm or the lower arm and a reverse recovery current of the other arm are disposed close to each other in parallel, and a direction of the gate current path is the same as a direction of the reverse recovery current path.

Also, in the electric circuit according to the above embodiment, a wiring connecting the upper arm and the lower arm and a gate wiring of the lower arm are disposed close to each other in parallel, and a direction of a current flowing through the gate wiring of the lower arm is the same as a direction of a reverse recovery current flowing from the first diode element of the upper arm toward the lower arm.

Also, in the electric circuit according to the above embodiment, a wiring connecting the lower arm and a power source and the gate wiring of the upper arm are disposed close to each other in parallel, and a direction of a current flowing through the gate wiring of the upper arm is the same as a direction of a reverse recovery current flowing from the second diode element of the lower arm toward the power source.

Also, in a semiconductor module according to the above embodiment, a semiconductor element forming an upper arm and another semiconductor element forming a lower arm are connected in series, wherein a control wiring member forming a gate current path of one arm of either the upper arm or the lower arm and a main current wiring member forming a reverse recovery current path of the other arm are disposed close to each other in parallel, and a direction of the gate current path is the same as a direction of the reverse recovery current path.

Also, the semiconductor module according to the above embodiment includes a first control wiring member that electrically connects a gate electrode of the semiconductor element forming the upper arm and an external connection terminal for inputting a gate signal of the upper arm, and a second main current wiring member that electrically connects the semiconductor element forming the lower arm and an external connection terminal on a negative electrode side, wherein the first control wiring member is disposed adjacently and extending in parallel with the second main current wiring member, and a direction of a current flowing through the first control wiring member is the same as a direction of a reverse recovery current flowing through the second main current wiring member.

Also, the semiconductor module according to the above embodiment includes a first main current wiring member that electrically connects the semiconductor element forming the upper arm and the other semiconductor element forming the lower arm, and a second control wiring member that electrically connects a gate electrode of the other semiconductor element forming the lower arm and an external connection terminal for inputting a gate signal of the lower arm, wherein the second control wiring member is disposed adjacently and extending in parallel with the first main current wiring member, and a direction of a current flowing through the second control wiring member is the same as a direction of a reverse recovery current flowing through the first main current wiring member.

Also, in the semiconductor module according to the above embodiment, a direction of the first control wiring member extending from the external connection terminal for inputting the gate signal of the upper arm to the gate electrode of the upper arm is the same as a direction of the second main current wiring member extending from the lower arm toward the external connection terminal on the negative electrode side, and a direction of the second control wiring member extending from the external connection terminal for inputting the gate signal of the lower arm toward the gate electrode of the lower arm is the same as a direction of the first main current wiring member extending from the semiconductor element forming the upper arm toward the other semiconductor element forming the lower arm.

Also, in the semiconductor module according to the above embodiment, the first main current wiring member and the second main current wiring member are disposed with the first control wiring member and the second control wiring member in between in a direction intersecting an extension direction, the first control wiring member is disposed near the second main current wiring member, and the second control wiring member is disposed near the first main current wiring member.

Also, in the semiconductor module according to the above embodiment, the first main current wiring member includes a conductor wire, a circuit board formed on a laminated substrate, or a metal wiring plate, the second main current wiring member includes a conductor wire, a circuit board formed on a laminated substrate, or a metal wiring plate, the first control wiring member is a first gate wiring circuit board formed on a laminated substrate, and the second control wiring member is a second gate wiring circuit board formed on a laminated substrate.

Also, in the semiconductor module according to the above embodiment, the upper arm is formed such that a first switching element and a first diode element are connected in parallel, the lower arm is formed such that a second switching element and a second diode element are connected in parallel, the semiconductor module includes a first circuit board on which the first switching element and the first diode element are arranged and a second circuit board on which the second switching element and the second diode element are arranged, the first circuit board and the second circuit board are disposed with the first gate wiring circuit board and the second gate wiring circuit board in between in a direction intersecting an extension direction, the first gate wiring circuit board is disposed on a side near the second circuit board, and the second gate wiring circuit board is disposed on a side near the first circuit board.

Also, in the semiconductor module according to the above embodiment, the first gate wiring circuit board has a length equal to or greater than a width of the second switching element and the second diode element in an arrangement direction, and the second gate wiring circuit board has a length equal to or greater than a width of the first switching element and the first diode element in an arrangement direction.

Also, in the semiconductor module according to the above embodiment, a direction of a current flowing through the first control wiring member is the reverse of a direction of a current flowing through the second control wiring member, and a direction of a current flowing through the second main current wiring member is the reverse of a direction of a current flowing through the first main current wiring member.

Also, in the semiconductor module according to the above embodiment, an arrangement order of the first switching element and the first diode element is the reverse of an arrangement order of the second switching element and the second diode element.

Also, in the semiconductor module according to the above embodiment, a direction of a current flowing through the first control wiring member is the same as a direction of a current flowing through the second control wiring member, and a direction of a current flowing through the second main current wiring member is the same as a direction of a current flowing through the first main current wiring member.

Also, in the semiconductor module according to the above embodiment, an arrangement order of the first switching element and the first diode element is the same as an arrangement order of the second switching element and the second diode element.

Also, in the semiconductor module according to the above embodiment, the first main current wiring member is a first main current circuit board formed on a laminated substrate, and the second main current wiring member is a second main current circuit board formed on a laminated substrate.

Also, in the semiconductor module according to the above embodiment, the first circuit board and the second circuit board are arranged in the arrangement direction of the first switching element and the first diode element or the arrangement direction of the second switching element and the second diode element, the first gate wiring circuit board and the second gate wiring circuit board are disposed with the first circuit board and the second circuit board in between, and the first main current wiring member and the second main current wiring member are disposed with the first gate wiring circuit board and the second gate wiring circuit board in between.

Also, in the semiconductor module according to the above embodiment, the second diode element, the second switching element, the first switching element, and the first diode element are arranged in the above order.

Also, the semiconductor module according to the above embodiment further includes a laminated substrate on which the semiconductor element forming the upper arm and the other semiconductor element forming the lower arm are disposed and an auxiliary board having one face on which the first gate wiring circuit board and the second gate wiring circuit board are formed and another face on which the first main current wiring member and the second main current wiring member are formed through an insulating plate, wherein the auxiliary board is disposed above the laminated substrate.

Also, the semiconductor module according to the above embodiment further includes a laminated substrate on which the semiconductor element forming the upper arm and the other semiconductor element forming the lower arm are disposed, wherein the first main current wiring member, the second main current wiring member, the first gate wiring circuit board, and the second gate wiring circuit board each include a metal wiring plate formed independently from the laminated substrate.

INDUSTRIAL APPLICABILITY

As described above, the present invention lowers the switching speed in the current region where the voltage variations are sudden and does not lower the switching speed excessively in the current region where the voltage variations are not sudden. Consequently, an effect of suppressing electromagnetic radiation noise while also suppressing an increase in loss during switching is achieved, which is particularly useful in an electric circuit and a semiconductor module.

This application is based on Japanese Patent Application No. 2020-048329 filed on Mar. 18, 2020, the content of which is hereby incorporated in entirety.

What is claimed is:

1. An electric circuit, comprising:
a first semiconductor element forming an upper arm; and
a second semiconductor element forming a lower arm, wherein
the upper arm and the lower arm are connected in series,
each of the upper arm and the lower arm includes a control wiring member, a gate current path on the control wiring member, and a reverse recovery current path, a gate current flowing through the gate current path, a reverse recovery current flowing through the reverse recovery current path,
the gate current path of the upper arm is disposed closer to the reverse recovery current path of the lower arm than to the reverse recovery current path of the upper arm, and the gate current path of the lower arm is disposed closer to the reverse recovery current path of the upper arm than to the reverse recovery current path of the lower arm, and
the gate current path in one of the upper arm and the lower arm, and the reverse recovery path in the other one of the upper arm and the lower arm substantially in parallel and are adjacent to each other, whereby the reverse recovery current flowing through the reverse recovery path in the other arm and the gate current flowing through the gate current path in the one arm generate mutual inductance.

2. The electric circuit according to claim 1, further comprising:
a first reverse recovery wiring connecting the upper arm and the lower arm and forming the reverse recovery current path in the upper arm; and
a first gate wiring forming the gate current path in the lower arm, wherein
the first reverse recovery wiring and the first gate wiring are disposed-substantially in parallel to each other, and
the reverse recovery current passing through the first reverse recovery wiring and the gate current passing through the first gate wiring flow in a same direction so as to generate the mutual inductance therebetween.

3. The electric circuit according to claim 1, further comprising:
a second reverse recovery wiring connecting the lower arm and a power source of the electric circuit and forming the reverse recovery current path in the lower arm; and
a second gate wiring forming the gate current path in the upper arm, wherein
the second reverse recovery wiring and the second gate wiring are disposed substantially in parallel to each other, and
the reverse recovery current passing through the second reverse recovery wiring and the gate current passing through the second gate wiring flow in the same direction so as to generate the mutual inductance therebetween.

4. A semiconductor module, comprising:
an upper arm including
a first semiconductor element, and
a first control wiring member through which a first gate current flows, and
a first main current wiring member through which a first reverse recovery current flows;
a lower arm including
a second semiconductor element,
a second control wiring member through which a second gate current flows, and
a second main current wiring member through which a second reverse recovery current flows, wherein
the upper arm and the lower arm are connected in series,
the first control wiring member is disposed closer to the second main current wiring member than to the first main current wiring member, and the second control wiring member is disposed closer to first main current wiring member than to the second main current wiring member, and
the first control wiring member and the second main current wiring member and/or the second control wiring member and the first main current wiring member extend substantially in parallel and are adjacent to each other, whereby the first gate current and the second reverse recovery current and/or the second gate current and the first reverse recovery current generate mutual inductance.

5. The semiconductor module according to claim 4, wherein
the first control wiring member is electrically connected to a gate electrode of the first semiconductor element for inputting a gate signal to the gate electrode of the first semiconductor element from a first external connection terminal,
the second main current wiring member is electrically connected to the second semiconductor element and a second external connection terminal connected to a negative side of a power source of the semiconductor module,
the first control wiring member extends in substantially parallel with and is adjacent to the second main current wiring member, and
the second reverse recovery current passing through the second main current wiring member and the first gate current passing through the first control wiring member flow in the same direction so as to generate the mutual inductance therebetween.

6. The semiconductor module according to claim 4, wherein
the first main current wiring member electrically connects the first semiconductor element and the second semiconductor element,
the second control wiring member is electrically connected to a gate electrode of the second semiconductor element for inputting a gate signal to the gate electrode of the second semiconductor element from a third external connection terminal,
the second control wiring member substantially in parallel with and adjacent to the first main current wiring member, and
the first reverse recovery current passing through the first main current wiring member and the second gate current passing through the second control wiring member flow in the same direction so as to generate the mutual inductance therebetween.

7. The semiconductor module according to claim 4, wherein
the first control wiring member is electrically connected to a gate electrode of the first semiconductor element for inputting a gate signal to the gate electrode of the first semiconductor element from a first external connection terminal, and extends in a first direction,
the second main current wiring member extends in the first direction between the lower arm and a second external connection terminal connected to a negative side of a power source of the semiconductor module,
the second control wiring member is electrically connected to a gate electrode of the second semiconductor element for inputting a gate signal to the gate electrode of the second semiconductor element from a third external connection terminal, and extends in a second direction, and
the first main current wiring member extends in the second direction between the first semiconductor element and the second semiconductor element.

8. The semiconductor module according to claim 7, further comprising a laminated substrate on which the first and second semiconductor elements are disposed, wherein
the first main current wiring member is one of a first conductor wire, a first main current circuit board disposed on the laminated substrate, or a first metal wiring plate,
the second main current wiring member is one of a second conductor wire, a second main current circuit board disposed on the laminated substrate, or a second metal wiring plate,
the first control wiring member is a first gate wiring circuit board disposed on the laminated substrate, and the second control wiring member is a second gate wiring circuit board disposed on the laminated substrate.

9. The semiconductor module according to claim 8, wherein the first semiconductor element includes a first switching element and a first diode element that are connected in parallel to form the upper arm, the second semiconductor element includes a second switching element and a second diode element that are connected in parallel to form the lower arm, the upper arm includes a first circuit board on which the first switching element and the first diode element are arranged, the first circuit board being disposed apart from the first gate wiring circuit board, the lower arm includes a second circuit board on which the second switching element and the second diode element are arranged, the second circuit board being disposed apart from the second gate wiring circuit board, the first direction and the second direction being parallel to each other, the first circuit board and the second circuit board sandwich the first gate wiring circuit board and the second gate wiring circuit board therebetween, from a direction orthogonal to the first direction, the first gate wiring circuit board is disposed closer to the second circuit board than is the second gate wiring circuit board, and the second gate wiring circuit board is disposed closer to the first circuit board than is the first gate wiring circuit board.

10. The semiconductor module according to claim 9, wherein the first gate wiring circuit board has a length in the first direction equal to or greater than a length of an area in which the second switching element and the second diode element are arranged, and the second gate wiring circuit board has a length in the second direction equal to or greater than a length of an area in which the first switching element and the first diode element are arranged.

11. The semiconductor module according to claim 9, wherein a direction of the first gate current flowing through the first control wiring member is opposite to a direction of the second gate current flowing through the second control wiring member, and a direction of the second reverse recovery current flowing through the second main current wiring member is opposite to a direction of the first reverse recovery current flowing through the first main current wiring member.

12. The semiconductor module according to claim 9, wherein the laminated substrate has a first side and a second side opposite to each other in an arrangement direction in which the first switching element and the first diode element, and the second switching element and the second diode element are respectively arranged, and in the arrangement direction, the first switching element is disposed closer to the first side of the laminated substrate than is the first diode element, and the second diode element is disposed closer to the first side than is the second switching element.

13. The semiconductor module according to claim 9, wherein a direction of the first gate current flowing through the first control wiring member is the same as a direction of the second gate current flowing through the second control wiring member, and a direction of the second reverse recovery current flowing through the second main current wiring member is the same as a direction of the first reverse recovery current flowing through the first main current wiring member.

14. The semiconductor module according to claim 13, wherein the laminated substrate has a first side and a second side opposite to each other in an arrangement direction in which the first switching element and the first diode element, and the second switching element and the second diode element are respectively arranged, and in the arrangement direction, the first switching element is disposed closer to the first side of the laminated substrate than is the first diode element, and the second switching element is disposed closer to the first side of the laminated substrate than is the second diode element.

15. The semiconductor module according to claim 9, further comprising:

a first main current circuit board disposed on the laminated substrate and forming the first main current wiring member; and a second main current circuit board disposed on the laminated substrate and forming the second main current wiring member.

16. The semiconductor module according to claim 7, further comprising:

an auxiliary board having an insulating plate, the insulating plate having one surface on which the first gate wiring circuit board and the second gate wiring circuit board are disposed and another surface on which the first main current wiring member and the second main current wiring member are disposed, the auxiliary board being disposed above the laminated substrate in a direction orthogonal to a main surface of the laminated substrate.

17. The semiconductor module according to claim 7, further comprising:

a plurality of metal wiring plates, each of which is a different element than the luminated substrate, the first main current wiring member, the second main current wiring member, the first gate wiring circuit board, and the second gate wiring circuit board each being disposed on a respective one of the plurality of metal wiring plates.

* * * * *